(12) United States Patent
Silverbrook et al.

(10) Patent No.: US 7,741,720 B2
(45) Date of Patent: Jun. 22, 2010

(54) ELECTRONIC DEVICE WITH WIRE BONDS ADHERED BETWEEN INTEGRATED CIRCUITS DIES AND PRINTED CIRCUIT BOARDS

(75) Inventors: Kia Silverbrook, Balmain (AU); Laval Chung-Long-Shan, Balmain (AU); Kiangkai Tankongchumruskul, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 120 days.

(21) Appl. No.: 12/046,453

(22) Filed: Mar. 12, 2008

(65) Prior Publication Data

US 2009/0079081 A1 Mar. 26, 2009

Related U.S. Application Data

(63) Continuation-in-part of application No. 11/860,539, filed on Sep. 25, 2007.

(51) Int. Cl.
*H01L 23/48* (2006.01)

(52) U.S. Cl. ............... 257/771; 257/784; 257/E23.168; 257/E23.151

(58) Field of Classification Search ................. 257/771, 257/784, E23.158, E23.151
See application file for complete search history.

(56) References Cited

U.S. PATENT DOCUMENTS

| | | | |
|---|---|---|---|
| 5,008,736 A * | 4/1991 | Davies et al. ............... 361/103 |
| 5,468,999 A | 11/1995 | Lin et al. |
| 5,577,319 A | 11/1996 | Knecht |
| 6,022,583 A | 2/2000 | Falcone et al. |
| 6,143,588 A | 11/2000 | Glenn |
| 6,313,519 B1 * | 11/2001 | Gainey et al. ............... 257/676 |
| 6,414,849 B1 * | 7/2002 | Chiu ............................ 361/760 |
| 6,429,515 B1 * | 8/2002 | Glenn ......................... 257/734 |
| 6,482,574 B1 | 11/2002 | Ramaswami et al. |
| 6,644,782 B1 * | 11/2003 | Ward et al. .................... 347/40 |
| 6,672,710 B1 | 1/2004 | Silverbrook et al. |
| 6,885,093 B2 | 4/2005 | Lo et al. |
| 7,091,581 B1 | 8/2006 | McLellan et al. |
| 7,227,086 B2 | 6/2007 | Lee et al. |
| 7,262,074 B2 * | 8/2007 | Hall et al. ..................... 438/106 |
| 7,275,308 B2 * | 10/2007 | Kim et al. ...................... 29/611 |
| 2001/0014486 A1 | 8/2001 | Glenn |
| 2003/0146464 A1 | 8/2003 | Prophet |
| 2003/0160311 A1 | 8/2003 | Ismail et al. |
| 2004/0100532 A1 | 5/2004 | Silverbrook |
| 2005/0093397 A1 | 5/2005 | Yamada et al. |
| 2007/0045872 A1 | 3/2007 | Fee |
| 2007/0273023 A1 | 11/2007 | Zhao et al. |
| 2008/0315411 A1 * | 12/2008 | Dahilig et al. ............... 257/737 |
| 2009/0032926 A1 * | 2/2009 | Sharifi ......................... 257/686 |

FOREIGN PATENT DOCUMENTS

| | | |
|---|---|---|
| JP | 10-092858 A | 4/1998 |
| JP | 11-067807 A | 3/1999 |
| KR | 2004-0086064 A | 10/2004 |
| WO | WO 03/006230 A1 | 1/2003 |

* cited by examiner

*Primary Examiner*—Sue Purvis
*Assistant Examiner*—Krista Soderholm

(57) ABSTRACT

An electronic device that has an integrated circuit die with a plurality of contacts pads, a printed circuit board with a plurality of conductors corresponding to each of the contact pads respectively, wire bonds electrically connecting each of the contact pads to the corresponding conductors and, an adhesive surface positioned between the contacts pads and the corresponding conductors. The wire bonds are secured to the adhesive surface to hold them in a low profile configuration.

15 Claims, 12 Drawing Sheets

ELECTRONIC DEVICE WITH WIRE BONDS ADHERED BETWEEN INTEGRATED CIRCUITS DIES AND PRINTED CIRCUIT BOARDS

The present application is a Continuation-In-Part of U.S. Ser. No. 11/860,539, filed Sep. 25, 2007, the contents of which are incorporated herein by cross reference.

FIELD OF THE INVENTION

The invention relates to the field of integrated circuits. In particular, the invention is directed to the wire bonds between a circuit board and the contact pads on the integrated circuit die.

CO-PENDING APPLICATIONS

The following application has been filed by the Applicant simultaneously with the present application:

12046451 12046452 12046454

The disclosure of this co-pending application is incorporated herein by reference.

CROSS REFERENCES TO RELATED APPLICATIONS

Various methods, systems and apparatus relating to the present invention are disclosed in the following US Patents/Patent applications filed by the applicant or assignee of the present invention:

| | | | | | | |
|---|---|---|---|---|---|---|
| 6,276,850 | 6,520,631 | 6,158,907 | 6,539,180 | 6,270,177 | 6,405,055 | 6,628,430 |
| 6,835,135 | 6,626,529 | 6,981,769 | 7,125,338 | 7,125,337 | 7,136,186 | 7,286,260 |
| 7,145,689 | 7,130,075 | 7,081,974 | 7,177,055 | 7,209,257 | 6,443,555 | 7,161,715 |
| 7,154,632 | 7,158,258 | 7,148,993 | 7,075,684 | 10/943,905 | 10/943,906 | 10/943,904 |
| 10/943,903 | 10/943,902 | 6,966,659 | 6,988,841 | 7,077,748 | 7,255,646 | 7,070,270 |
| 7,014,307 | 7,158,809 | 7,217,048 | 11/225,172 | 11/255,942 | 11/329,039 | 11/329,040 |
| 7,271,829 | 11/442,189 | 11/474,280 | 11/483,061 | 11/503,078 | 11/520,735 | 11/505,858 |
| 11/525,850 | 11/583,870 | 11/592,983 | 11/592,208 | 11/601,828 | 11/635,482 | 11/635,526 |
| 10/466,440 | 7,215,441 | 11/650,545 | 11/653,241 | 11/653,240 | 7,056,040 | 6,942,334 |
| 11/706,300 | 11/740,265 | 11/737,720 | 11/739,056 | 11/740,204 | 11/740,223 | 11/753,557 |
| 11/750,285 | 11/758,648 | 11/778,559 | 11/834,634 | 11/838,878 | 11/845,669 | 12/015,407 |
| 12/017,331 | 12/030,823 | 6,799,853 | 7,237,896 | 6,749,301 | 10/451,722 | 7,137,678 |
| 7,252,379 | 7,144,107 | 10/503,900 | 10/503,898 | 10/503,897 | 7,220,068 | 7,270,410 |
| 7,241,005 | 7,108,437 | 7,140,792 | 10/503,922 | 7,224,274 | 10/503,917 | 10/503,918 |
| 10/503,925 | 10/503,927 | 10/503,928 | 10/503,929 | 10/503,885 | 7,195,325 | 7,229,164 |
| 7,150,523 | 10/503,889 | 7,154,580 | 6,906,778 | 7,167,158 | 7,128,269 | 6,688,528 |
| 6,986,613 | 6,641,315 | 7,278,702 | 10/503,891 | 7,150,524 | 7,155,395 | 6,915,140 |
| 6,999,206 | 6,795,651 | 6,883,910 | 7,118,481 | 7,136,198 | 7,092,130 | 6,786,661 |
| 6,808,325 | 10/920,368 | 10/920,284 | 7,219,990 | 10/920,283 | 6,750,901 | 6,476,863 |
| 6,788,336 | 6,322,181 | 6,597,817 | 6,227,648 | 6,727,948 | 6,690,419 | 10/470,947 |
| 6,619,654 | 6,969,145 | 6,679,582 | 7,328,896 | 6,568,670 | 6,866,373 | 7,280,247 |
| 7,008,044 | 6,742,871 | 6,966,628 | 6,644,781 | 6,969,143 | 6,767,076 | 6,834,933 |
| 6,692,113 | 6,913,344 | 6,727,951 | 7,128,395 | 7,036,911 | 7,032,995 | 6,969,151 |
| 6,955,424 | 6,969,162 | 10/919,249 | 6,942,315 | 11/006,577 | 7,234,797 | 6,986,563 |
| 7,295,211 | 11/045,442 | 7,286,162 | 7,283,159 | 7,077,330 | 6,196,541 | 7,303,257 |
| 11/185,725 | 7,226,144 | 11/202,344 | 7,267,428 | 11/248,423 | 11/248,422 | 7,093,929 |
| 11/282,769 | 11/330,060 | 11/442,111 | 7,290,862 | 11/499,806 | 11/499,710 | 6,195,150 |
| 11/749,156 | 11/782,588 | 11/854,435 | 11/853,817 | 11/935,958 | 11/924,608 | 6,362,868 |
| 11/970,993 | 12/031,526 | 6,831,681 | 6,431,669 | 6,362,869 | 6,472,052 | 6,356,715 |
| 6,894,694 | 6,636,216 | 6,366,693 | 6,329,990 | 6,459,495 | 6,137,500 | 6,690,416 |
| 7,050,143 | 6,398,328 | 7,110,024 | 6,431,704 | 6,879,341 | 6,415,054 | 6,665,454 |
| 6,542,645 | 6,486,886 | 6,381,361 | 6,317,192 | 6,850,274 | 09/113,054 | 6,646,757 |
| 6,624,848 | 6,357,135 | 6,271,931 | 6,353,772 | 6,106,147 | 6,665,008 | 6,304,291 |
| 6,305,770 | 6,289,262 | 6,315,200 | 6,217,165 | 6,496,654 | 6,859,225 | 6,924,835 |
| 6,647,369 | 6,943,830 | 09/693,317 | 7,021,745 | 6,712,453 | 6,460,971 | 6,428,147 |
| 6,416,170 | 6,402,300 | 6,464,340 | 6,612,687 | 6,412,912 | 6,447,099 | 6,837,567 |
| 6,505,913 | 7,128,845 | 6,733,684 | 7,249,108 | 6,566,858 | 6,331,946 | 6,246,970 |
| 6,442,525 | 09/517,384 | 09/505,951 | 6,374,354 | 7,246,098 | 6,816,968 | 6,757,832 |
| 6,334,190 | 6,745,331 | 7,249,109 | 7,197,642 | 7,093,139 | 10/636,263 | 10/636,283 |
| 10/866,608 | 7,210,038 | 10/902,883 | 10/940,653 | 10/942,858 | 11/706,329 | 11/757,385 |
| 11/758,642 | 7,119,836 | 7,283,162 | 7,286,169 | 10/636,285 | 7,170,652 | 6,967,750 |
| 6,995,876 | 7,099,051 | 7,172,191 | 7,243,916 | 7,222,845 | 11/239,232 | 7,285,227 |
| 7,063,940 | 11/107,942 | 7,193,734 | 7,086,724 | 7,090,337 | 7,278,723 | 7,140,717 |
| 11/190,902 | 11/209,711 | 7,256,824 | 7,140,726 | 7,156,512 | 7,186,499 | 11/478,585 |
| 11/525,862 | 11/540,574 | 11/583,875 | 11/592,181 | 6,750,944 | 11/599,336 | 7,291,447 |
| 11/744,183 | 11/758,646 | 11/778,561 | 11/839,532 | 11/838,874 | 11/853,021 | 11/869,710 |
| 11/868,531 | 11/927,403 | 11/951,960 | 12/019,556 | 10/636,225 | 6,985,207 | 6,773,874 |
| 6,650,836 | 7,324,142 | 10/636,224 | 7,250,975 | 7,295,343 | 6,880,929 | 7,236,188 |
| 7,236,187 | 7,155,394 | 10/636,219 | 10/636,223 | 7,055,927 | 6,986,562 | 7,052,103 |
| 7,312,845 | 10/656,281 | 10/656,791 | 10/666,124 | 10/683,217 | 7,289,142 | 7,095,533 |
| 6,914,686 | 6,896,252 | 6,820,871 | 6,834,851 | 6,848,686 | 6,830,246 | 6,851,671 |
| 10/729,098 | 7,092,011 | 7,187,404 | 10/729,159 | 10/753,458 | 6,878,299 | 6,929,348 |
| 6,921,154 | 10/780,625 | 10/804,042 | 6,913,346 | 10/831,238 | 10/831,237 | 10/831,239 |
| 10/831,240 | 10/831,241 | 10/831,234 | 10/831,233 | 7,246,897 | 7,077,515 | 10/831,235 |
| 10/853,336 | 10/853,117 | 10/853,659 | 10/853,681 | 6,913,875 | 7,021,758 | 7,033,017 |
| 7,161,709 | 7,099,033 | 7,147,294 | 7,156,494 | 11/012,024 | 11/011,925 | 7,032,998 |
| 7,044,585 | 7,296,867 | 6,994,424 | 11/006,787 | 7,258,435 | 7,097,263 | 7,001,012 |
| 7,004,568 | 7,040,738 | 7,188,933 | 7,027,080 | 7,025,446 | 6,991,321 | 7,131,715 |
| 7,261,392 | 7,207,647 | 7,182,435 | 7,097,285 | 7,331,646 | 7,097,284 | 7,083,264 |
| 7,147,304 | 7,232,203 | 7,156,498 | 7,201,471 | 11/501,772 | 11/503,084 | 11/513,073 |
| 7,210,764 | 11/635,524 | 11/706,379 | 11/730,386 | 11/730,784 | 11/753,568 | 11/782,591 |

-continued

| | | | | | | |
|---|---|---|---|---|---|---|
| 11/859,783 | 12/015,243 | 12/037,069 | 6,710,457 | 6,775,906 | 6,507,099 | 7,221,043 |
| 7,107,674 | 7,154,172 | 11/442,400 | 7,247,941 | 11/736,540 | 7,307,354 | 11/940,304 |
| 6,530,339 | 6,631,897 | 6,851,667 | 6,830,243 | 6,860,479 | 6,997,452 | 7,000,913 |
| 7,204,482 | 11/212,759 | 11/281,679 | 11/730,409 | 6,238,044 | 6,425,661 | 11/003,786 |
| 7,258,417 | 7,293,853 | 7,328,968 | 7,270,395 | 11/003,404 | 11/003,419 | 7,334,864 |
| 7,255,419 | 7,284,819 | 7,229,148 | 7,258,416 | 7,273,263 | 7,270,393 | 6,984,017 |
| 11/003,699 | 11/071,473 | 7,156,497 | 11/601,670 | 11/748,482 | 11/778,563 | 11/779,851 |
| 11/778,574 | 11/853,816 | 11/853,814 | 11/853,786 | 11/872,037 | 11/856,694 | 11/965,703 |
| 11/971,170 | 12/023,011 | 12/036,896 | 11/003,463 | 11/003,701 | 11/003,683 | 11/003,614 |
| 7,284,820 | 7,341,328 | 7,246,875 | 7,322,669 | 11/764,760 | 11/853,777 | 11/955,354 |
| 12/022,994 | 11/293,800 | 11/293,802 | 11/293,801 | 11/293,808 | 11/293,809 | 11/482,975 |
| 11/482,970 | 11/482,968 | 11/482,972 | 11/482,971 | 11/482,969 | 6,431,777 | 6,334,664 |
| 6,447,113 | 7,239,407 | 6,398,359 | 6,652,089 | 6,652,090 | 7,057,759 | 6,631,986 |
| 7,187,470 | 7,280,235 | 11/501,775 | 11/744,210 | 11/859,784 | 6,471,331 | 6,676,250 |
| 6,347,864 | 6,439,704 | 6,425,700 | 6,588,952 | 6,626,515 | 6,722,758 | 6,871,937 |
| 11/060,803 | 11/097,266 | 7,328,976 | 11/685,084 | 11/685,086 | 11/685,090 | 11/740,925 |
| 11/763,444 | 11/763,443 | 11/946,840 | 11/961,712 | 12/017,771 | 7,249,942 | 7,206,654 |
| 7,162,324 | 7,162,325 | 7,231,275 | 7,146,236 | 7,278,847 | 10/753,499 | 6,997,698 |
| 7,220,112 | 7,231,276 | 10/753,440 | 7,220,115 | 7,195,475 | 7,144,242 | 7,306,323 |
| 7,306,319 | 11/525,858 | 7,322,674 | 11/599,335 | 11/706,380 | 11/736,545 | 11/736,554 |
| 11/739,047 | 11/749,159 | 11/739,073 | 11/775,160 | 11/853,755 | 11/940,291 | 11/934,071 |
| 11/951,913 | 6,786,420 | 6,827,282 | 6,948,661 | 7,073,713 | 10/983,060 | 7,093,762 |
| 7,083,108 | 7,222,799 | 7,201,319 | 11/442,103 | 11/739,071 | 11/518,238 | 11/518,280 |
| 11/518,244 | 11/518,243 | 11/518,242 | 7,032,899 | 6,854,724 | 7,331,651 | 7,334,870 |
| 7,334,875 | 11/357,296 | 11/357,298 | 11/357,297 | 12/015,479 | 12/017,270 | 12/015,218 |
| 6,350,023 | 6,318,849 | 6,592,207 | 6,439,699 | 6,312,114 | 11/246,676 | 11/246,677 |
| 11/246,678 | 11/246,679 | 11/246,680 | 11/246,681 | 11/246,714 | 11/246,713 | 11/246,689 |
| 11/246,671 | 11/246,670 | 11/246,669 | 11/246,704 | 11/246,710 | 11/246,688 | 11/246,716 |
| 11/246,715 | 11/246,707 | 11/246,706 | 11/246,705 | 11/246,708 | 11/246,693 | 11/246,692 |
| 11/246,696 | 11/246,695 | 11/246,694 | 11/482,958 | 11/482,955 | 11/482,962 | 11/482,963 |
| 11/482,956 | 11/482,954 | 11/482,974 | 11/482,957 | 11/482,987 | 11/482,959 | 11/482,960 |
| 11/482,961 | 11/482,964 | 11/482,965 | 11/482,976 | 11/482,973 | 11/495,815 | 11/495,816 |
| 11/495,817 | 6,099,2635 | 6,099,2637 | 6,099,2641 | 10/803,074 | 10/803,073 | 7,040,823 |
| 10/803,076 | 10/803,077 | 10/803,078 | 10/803,079 | 10/922,971 | 10/922,970 | 10/922,836 |
| 10/922,842 | 10/922,848 | 10/922,843 | 7,125,185 | 7,229,226 | 11/513,386 | 11/753,559 |
| 10/815,621 | 7,243,835 | 10/815,630 | 10/815,637 | 10/815,638 | 7,251,050 | 10/815,642 |
| 7,097,094 | 7,137,549 | 10/815,618 | 7,156,292 | 11/738,974 | 10/815635 | 10/815,647 |
| 10/815,634 | 7,137,566 | 7,131,596 | 7,128,265 | 7,207,485 | 7,197,374 | 7,175,089 |
| 10/815,617 | 10/815,620 | 7,178,719 | 10/815,613 | 7,207,483 | 7,296,737 | 7,270,266 |
| 10/815,614 | 7,314,181 | 11/488,162 | 11/488,163 | 11/488,164 | 11/488,167 | 11/488,168 |
| 11/488,165 | 11/488,166 | 7,267,273 | 11/834,628 | 11/839,497 | 11/944,449 | 10/815,636 |
| 7,128,270 | 11/041,650 | 11/041,651 | 11/041,652 | 11/041,649 | 11/041,610 | 11/863,253 |
| 11/863,255 | 11/863,257 | 11/863,258 | 11/863,262 | 11/041,609 | 11/041,626 | 11/041,627 |
| 11/041,624 | 11/041,625 | 11/863,268 | 11/863,269 | 11/863,270 | 11/863,271 | 11/863,273 |
| 7,658,4733 | 11/041,556 | 11/041,580 | 11/041,723 | 11/041,698 | 11/041,648 | 11/863,263 |
| 11/863,264 | 11/863,265 | 11/863,266 | 11/863,267 | 10/815,609 | 7,150,398 | 7,159,777 |
| 10/815,610 | 7,188,769 | 7,097,106 | 7,070,110 | 7,243,849 | 7,314,177 | 11/480,957 |
| 11/764,694 | 11/957,470 | 6,227,652 | 6,213,588 | 6,213,589 | 6,231,163 | 6,247,795 |
| 6,394,581 | 6,244,691 | 6,257,704 | 6,416,168 | 6,220,694 | 6,257,705 | 6,247,794 |
| 6,234,610 | 6,247,793 | 6,264,306 | 6,241,342 | 6,247,792 | 6,264,307 | 6,254,220 |
| 6,234,611 | 6,302,528 | 6,283,582 | 6,239,821 | 6,338,547 | 6,247,796 | 6,557,977 |
| 6,390,603 | 6,362,843 | 6,293,653 | 6,312,107 | 6,227,653 | 6,234,609 | 6,238,040 |
| 6,188,415 | 6,227,654 | 6,209,989 | 6,247,791 | 6,336,710 | 6,217,153 | 6,416,167 |
| 6,243,113 | 6,283,284 | 6,247,790 | 6,260,953 | 6,267,469 | 6,588,882 | 6,742,873 |
| 6,918,655 | 6,547,371 | 6,938,989 | 6,598,964 | 6,923,526 | 6,273,544 | 6,309,048 |
| 6,420,196 | 6,443,558 | 6,439,689 | 6,378,989 | 6,848,181 | 6,634,735 | 6,299,289 |
| 6,299,290 | 6,425,654 | 6,902,255 | 6,623,101 | 6,406,129 | 6,505,916 | 6,457,809 |
| 6,550,895 | 6,457,812 | 7,152,962 | 6,428,133 | 7,216,956 | 7,080,895 | 11/144,844 |
| 7,182,437 | 11/599,341 | 11/635,533 | 11/607,976 | 11/607,975 | 11/607,999 | 11/607,980 |
| 11/607,979 | 11/607,978 | 11/735,961 | 11/685,074 | 11/696,126 | 11/696,144 | 11/696,650 |
| 11/763,446 | 6,224,780 | 6,235,212 | 6,280,643 | 6,284,147 | 6,214,244 | 6,071,750 |
| 6,267,905 | 6,251,298 | 6,258,285 | 6,225,138 | 6,241,904 | 6,299,786 | 6,866,789 |
| 6,231,773 | 6,190,931 | 6,248,249 | 6,290,862 | 6,241,906 | 6,565,762 | 6,241,905 |
| 6,451,216 | 6,231,772 | 6,274,056 | 6,290,861 | 6,248,248 | 6,306,671 | 6,331,258 |
| 6,110,754 | 6,294,101 | 6,416,679 | 6,264,849 | 6,254,793 | 6,245,246 | 6,855,264 |
| 6,235,211 | 6,491,833 | 6,264,850 | 6,258,284 | 6,312,615 | 6,228,668 | 6,180,427 |
| 6,171,875 | 6,267,904 | 6,245,247 | 6,315,914 | 7,169,316 | 6,526,658 | 7,210,767 |
| 11/056,146 | 11/635,523 | 6,665,094 | 6,450,605 | 6,512,596 | 6,654,144 | 7,125,090 |
| 6,687,022 | 7,072,076 | 7,092,125 | 7,215,443 | 7,136,195 | 7,077,494 | 6,877,834 |
| 6,969,139 | 10/636,227 | 7,283,280 | 6,912,067 | 7,277,205 | 7,154,637 | 10/636,230 |
| 7,070,251 | 6,851,782 | 10/636,211 | 10/636,247 | 6,843,545 | 7,079,286 | 7,064,867 |
| 7,065,247 | 7,027,177 | 7,218,415 | 7,064,873 | 6,954,276 | 7,061,644 | 7,092,127 |
| 7,059,695 | 10/990,382 | 7,177,052 | 7,270,394 | 11/124,231 | 7,188,921 | 7,187,469 |
| 7,196,820 | 11/281,445 | 7,283,281 | 7,251,051 | 7,245,399 | 11/524,911 | 11/640,267 |
| 11/706,297 | 11/730,387 | 11/737,142 | 7,336,397 | 11/834,637 | 11/853,019 | 11/863,239 |
| 12/015,485 | 12/030,797 | 11/305,274 | 11/305,273 | 11/305,275 | 11/305,152 | 11/305,158 |
| 11/305,008 | 6,231,148 | 6,293,658 | 6,614,560 | 6,238,033 | 6,312,070 | 6,238,111 |
| 6,378,970 | 6,196,739 | 6,270,182 | 6,152,619 | 7,006,143 | 6,876,394 | 6,738,096 |
| 6,970,186 | 6,287,028 | 6,412,993 | 11/033,145 | 11/102,845 | 11/102,861 | 11/248,421 |

-continued

| | | | | | | |
|---|---|---|---|---|---|---|
| 11/672,878 | 7,204,941 | 7,282,164 | 10/815,628 | 11/845,672 | 7,278,727 | 10/913,373 |
| 10/913,374 | 10/913,372 | 7,138,391 | 7,153,956 | 10/913,380 | 10/913,379 | 10/913,376 |
| 7,122,076 | 7,148,345 | 11/172,816 | 11/172,815 | 11/172,814 | 11/482,990 | 11/482,986 |
| 11/482,985 | 11/454,899 | 11/583,942 | 11/592,990 | 11/849,360 | 11/831,961 | 11/831,962 |
| 11/831,963 | 6,095,1700 | 11/832,629 | 11/832,637 | 6,097,1535 | 6,102,7756 | 10/407,212 |
| 7,252,366 | 10/683,064 | 10/683,041 | 7,275,811 | 10/884,889 | 10/922,890 | 7,334,874 |
| 10/922,885 | 10/922,889 | 10/922,884 | 10/922,879 | 10/922,887 | 10/922,888 | 10/922,874 |
| 7,234,795 | 10/922,871 | 7,328,975 | 7,293,855 | 10/922,882 | 10/922,883 | 10/922,878 |
| 10/922,872 | 10/922,876 | 10/922,886 | 10/922,877 | 7,147,792 | 7,175,774 | 11/159,193 |
| 11/491,378 | 11/766,713 | 11/841,647 | 12/018,040 | 12/035,410 | 12/037,054 | 11/482,980 |
| 11/563,684 | 11/482,967 | 11/482,966 | 11/482,988 | 11/482,989 | 11/293,832 | 11/293,838 |
| 11/293,825 | 11/293,841 | 11/293,799 | 11/293,796 | 11/293,797 | 11/293,798 | 11/124,158 |
| 11/124,196 | 11/124,199 | 11/124,162 | 11/124,202 | 11/124,197 | 11/124,154 | 11/124,198 |
| 7,284,921 | 11/124,151 | 11/124,160 | 11/124,192 | 11/124,175 | 11/124,163 | 11/124,149 |
| 11/124,152 | 11/124,173 | 11/124,155 | 7,236,271 | 11/124,174 | 11/124,194 | 11/124,164 |
| 11/124,200 | 11/124,195 | 11/124,166 | 11/124,150 | 11/124,172 | 11/124,165 | 11/124,186 |
| 11/124,185 | 11/124,184 | 11/124,182 | 11/124,201 | 11/124,171 | 11/124,181 | 11/124,161 |
| 11/124,156 | 11/124,191 | 11/124,159 | 11/124,176 | 11/124,188 | 11/124,170 | 11/124,187 |
| 11/124,189 | 11/124,190 | 11/124,180 | 11/124,193 | 11/124,183 | 11/124,178 | 11/124,177 |
| 11/124,148 | 11/124,168 | 11/124,167 | 11/124,179 | 11/124,169 | 11/187,976 | 11/188,011 |
| 11/188,014 | 11/482,979 | 11/735,490 | 11/853,018 | 11/944,450 | 12/023,815 | 12/035,414 |
| 11/228,540 | 11/228,500 | 11/228,501 | 11/228,530 | 11/228,490 | 11/228,531 | 11/228,504 |
| 11/228,533 | 11/228,502 | 11/228,507 | 11/228,482 | 11/228,505 | 11/228,497 | 11/228,487 |
| 11/228,529 | 11/228,484 | 11/228,489 | 11/228,518 | 11/228,536 | 11/228,496 | 11/228,488 |
| 11/228,506 | 11/228,516 | 11/228,526 | 11/228,539 | 11/228,538 | 11/228,524 | 11/228,523 |
| 11/228,519 | 11/228,528 | 11/228,527 | 11/228,525 | 11/228,520 | 11/228,498 | 11/228,511 |
| 11/228,522 | 11/228,515 | 11/228,537 | 11/228,534 | 11/228,491 | 11/228,499 | 11/228,509 |
| 11/228,492 | 11/228,493 | 11/228,510 | 11/228,508 | 11/228,512 | 11/228,514 | 11/228,494 |
| 11/228,495 | 11/228,486 | 11/228,481 | 11/228,477 | 11/228,485 | 11/228,483 | 11/228,521 |
| 11/228,517 | 11/228,532 | 11/228,513 | 11/228,503 | 11/228,480 | 11/228,535 | 11/228,478 |
| 11/228,479 | 12/035,419 | 6,238,115 | 6,386,535 | 6,398,344 | 6,612,240 | 6,752,549 |
| 6,805,049 | 6,971,313 | 6,899,480 | 6,860,664 | 6,925,935 | 6,966,636 | 7,024,995 |
| 7,284,852 | 6,926,455 | 7,056,038 | 6,869,172 | 7,021,843 | 6,988,845 | 6,964,533 |
| 6,981,809 | 7,284,822 | 7,258,067 | 7,322,757 | 7,222,941 | 7,284,925 | 7,278,795 |
| 7,249,904 | 11/737,726 | 11/772,240 | 11/863,246 | 11/863,145 | 11/865,650 | 6,087,638 |
| 6,340,222 | 6,041,600 | 6,299,300 | 6,067,797 | 6,286,935 | 6,044,646 | 6,382,769 |
| 6,787,051 | 6,938,990 | 11/242,916 | 11/144,799 | 11/198,235 | 11/861,282 | 11/861,284 |
| 11/766,052 | 7,152,972 | 11/592,996 | D529952 | 6,390,605 | 6,322,195 | 6,612,110 |
| 6,480,089 | 6,460,778 | 6,305,788 | 6,426,014 | 6,364,453 | 6,457,795 | 6,315,399 |
| 6,338,548 | 7,040,736 | 6,938,992 | 6,994,425 | 6,863,379 | 6,540,319 | 6,994,421 |
| 6,984,019 | 7,008,043 | 6,997,544 | 6,328,431 | 6,991,310 | 10/965,772 | 7,140,723 |
| 6,328,425 | 6,982,184 | 7,267,423 | 7,134,741 | 7,066,577 | 7,152,945 | 7,303,689 |
| 7,021,744 | 6,991,320 | 7,155,911 | 11/107,799 | 6,595,624 | 7,152,943 | 7,125,103 |
| 7,328,971 | 7,290,857 | 7,285,437 | 7,229,151 | 11/330,058 | 7,237,873 | 11/329,163 |
| 11/442,180 | 11/450,431 | 7,213,907 | 6,417,757 | 11/482,951 | 11/545,566 | 11/583,826 |
| 11/604,315 | 11/604,323 | 11/643,845 | 11/706,950 | 11/730,399 | 11/749,121 | 11/753,549 |
| 11/834,630 | 11/935,389 | 11/869,670 | 7,095,309 | 11/945,157 | 11/957,473 | 11/967,235 |
| 12/017,896 | 6,854,825 | 6,623,106 | 6,672,707 | 6,575,561 | 6,817,700 | 6,588,885 |
| 7,075,677 | 6,428,139 | 6,575,549 | 6,846,692 | 6,425,971 | 7,063,993 | 6,383,833 |
| 6,955,414 | 6,412,908 | 6,746,105 | 6,953,236 | 6,412,904 | 7,128,388 | 6,398,343 |
| 6,652,071 | 6,793,323 | 6,659,590 | 6,676,245 | 7,201,460 | 6,464,332 | 6,659,593 |
| 6,478,406 | 6,978,613 | 6,439,693 | 6,502,306 | 6,966,111 | 6,863,369 | 6,428,142 |
| 6,874,868 | 6,390,591 | 6,799,828 | 6,896,358 | 7,018,016 | 10/296,534 | 6,328,417 |
| 6,322,194 | 6,382,779 | 6,629,745 | 6,565,193 | 6,609,786 | 6,609,787 | 6,439,908 |
| 6,684,503 | 6,843,551 | 6,764,166 | 6,561,617 | 10/510,092 | 6,557,970 | 6,546,628 |
| 10/510,098 | 6,652,074 | 6,820,968 | 7,175,260 | 6,682,174 | 7,303,262 | 6,648,453 |
| 6,834,932 | 6,682,176 | 6,998,062 | 6,767,077 | 7,278,717 | 6,755,509 | 10/534,813 |
| 6,692,108 | 10/534,811 | 6,672,709 | 7,303,263 | 7,086,718 | 10/534,881 | 6,672,710 |
| 10/534,812 | 6,669,334 | 7,322,686 | 7,152,958 | 7,281,782 | 6,824,246 | 7,264,336 |
| 6,669,333 | 10/534,815 | 6,820,967 | 7,306,326 | 6,736,489 | 7,264,335 | 6,719,406 |
| 7,222,943 | 7,188,419 | 7,168,166 | 6,974,209 | 7,086,719 | 6,974,210 | 7,195,338 |
| 7,252,775 | 7,101,025 | 11/474,281 | 11/485,258 | 11/706,304 | 11/706,324 | 11/706,326 |
| 11/706,321 | 11/772,239 | 11/782,598 | 11/829,941 | 11/852,991 | 11/852,986 | 11/936,062 |
| 11/934,027 | 11/955,028 | 12/034,578 | 12/036,908 | 11/763,440 | 11/763,442 | 11/246,687 |
| 11/246,718 | 7,322,681 | 11/246,686 | 11/246,703 | 11/246,691 | 11/246,711 | 11/246,690 |
| 11/246,712 | 11/246,717 | 11/246,709 | 11/246,700 | 11/246,701 | 11/246,702 | 11/246,668 |
| 11/246,697 | 11/246,698 | 11/246,699 | 11/246,675 | 11/246,674 | 11/246,667 | 11/829,957 |
| 11/829,960 | 11/829,961 | 11/829,962 | 11/829,963 | 11/829,966 | 11/829,967 | 11/829,968 |
| 11/829,969 | 11/946,839 | 11/946,838 | 11/946,837 | 11/951,230 | 7,156,508 | 7,159,972 |
| 7,083,271 | 7,165,834 | 7,080,894 | 7,201,469 | 7,090,336 | 7,156,489 | 10/760,233 |
| 10/760,246 | 7,083,257 | 7,258,422 | 7,255,423 | 7,219,980 | 10/760,253 | 10/760,255 |
| 10/760,209 | 7,118,192 | 10/760,194 | 7,322,672 | 7,077,505 | 7,198,354 | 7,077,504 |
| 10/760,189 | 7,198,355 | 10/760,232 | 7,322,676 | 7,152,959 | 7,213,906 | 7,178,901 |
| 7,222,938 | 7,108,353 | 7,104,629 | 11/446,227 | 11/454,904 | 11/472,345 | 11/474,273 |
| 7,261,401 | 11/474,279 | 11/482,939 | 7,328,972 | 7,322,673 | 7,306,324 | 7,306,325 |
| 11/603,824 | 11/601,756 | 11/601,672 | 7,303,261 | 11/653,253 | 11/706,328 | 11/706,299 |
| 11/706,965 | 11/737,080 | 11/737,041 | 11/778,062 | 11/778,566 | 11/782,593 | 11/934,018 |
| 11/945,157 | 11/951,095 | 11/951,828 | 11/954,906 | 11/954,949 | 11/967,226 | 7,303,930 |
| 11/246,672 | 11/246,673 | 11/246,683 | 11/246,682 | 60/939,086 | 11/860,538 | 11/860,539 |

-continued

| | | | | | | |
|---|---|---|---|---|---|---|
| 11/860,540 | 11/860,541 | 11/860,542 | 11/936,060 | 11/877,667 | 11/877,668 | 7,246,886 |
| 7,128,400 | 7,108,355 | 6,991,322 | 7,287,836 | 7,118,197 | 10/728,784 | 10/728,783 |
| 7,077,493 | 6,962,402 | 10/728,803 | 7,147,308 | 10/728,779 | 7,118,198 | 7,168,790 |
| 7,172,270 | 7,229,155 | 6,830,318 | 7,195,342 | 7,175,261 | 10/773,183 | 7,108,356 |
| 7,118,202 | 10/773,186 | 7,134,744 | 10/773,185 | 7,134,743 | 7,182,439 | 7,210,768 |
| 10/773,187 | 7,134,745 | 7,156,484 | 7,118,201 | 7,111,926 | 10/773,184 | 7,018,021 |
| 11/060,751 | 11/060,805 | 11/188,017 | 7,128,402 | 11/298,774 | 11/329,157 | 11/490,041 |
| 11/501,767 | 7,284,839 | 7,246,885 | 7,229,156 | 11/505,846 | 11/505,857 | 7,293,858 |
| 11/524,908 | 11/524,938 | 7,258,427 | 11/524,912 | 7,278,716 | 11/592,995 | 11/603,825 |
| 11/649,773 | 11/650,549 | 11/653,237 | 11/706,378 | 11/706,962 | 11/749,118 | 11/754,937 |
| 11/749,120 | 11/744,885 | 11/779,850 | 11/765,439 | 11/842,950 | 11/839,539 | 11/926,121 |
| 12/025,621 | 11/097,308 | 11/097,309 | 7,246,876 | 11/097,299 | 11/097,310 | 11/097,213 |
| 7,328,978 | 7,334,876 | 7,147,306 | 7,261,394 | 11/764,806 | 11/782,595 | 11/965,696 |
| 12/027,286 | 11/482,953 | 11/482,977 | 11/544,778 | 11/544,779 | 11/764,808 | 11/756,624 |
| 11/756,625 | 11/756,626 | 11/756,627 | 11/756,628 | 11/756,629 | 11/756,630 | 11/756,631 |
| 7,156,289 | 7,178,718 | 7,225,979 | 11/712,434 | 11/084,796 | 11/084,742 | 11/084,806 |
| 09/575,197 | 09/575,197 | 7,079,712 | 7,079,712 | 6,825,945 | 6,825,945 | 7,330,974 |
| 7,330,974 | 6,813,039 | 6,813,039 | 7,190,474 | 6,987,506 | 6,987,506 | 6,824,044 |
| 7,038,797 | 7,038,797 | 6,980,318 | 6,980,318 | 6,816,274 | 6,816,274 | 7,102,772 |
| 7,102,772 | 09/575,186 | 09/575,186 | 6,681,045 | 6,681,045 | 6,678,499 | 6,679,420 |
| 6,963,845 | 6,976,220 | 6,728,000 | 6,728,000 | 7,110,126 | 7,173,722 | 7,173,722 |
| 6,976,035 | 6,813,558 | 6,766,942 | 6,965,454 | 6,995,859 | 7,088,459 | 7,088,459 |
| 6,720,985 | 7,286,113 | 6,922,779 | 6,978,019 | 6,847,883 | 7,131,058 | 7,295,839 |
| 09/607,843 | 09/693,690 | 6,959,298 | 6,973,450 | 7,150,404 | 6,965,882 | 7,233,924 |
| 09/575,181 | 09/575,181 | 09/722,174 | 7,175,079 | 7,162,259 | 6,718,061 | 10/291,523 |
| 10/291,471 | 7,012,710 | 6,825,956 | 10/291,481 | 7,222,098 | 10/291,825 | 7,263,508 |
| 7,031,010 | 6,972,864 | 6,862,105 | 7,009,738 | 6,989,911 | 6,982,807 | 10/291,576 |
| 6,829,387 | 6,714,678 | 6,644,545 | 6,609,653 | 6,651,879 | 10/291,555 | 7,293,240 |
| 10/291,592 | 10/291,542 | 7,044,363 | 7,004,390 | 6,867,880 | 7,034,953 | 6,987,581 |
| 7,216,224 | 10/291,821 | 7,162,269 | 7,162,222 | 7,290,210 | 7,293,233 | 7,293,234 |
| 6,850,931 | 6,865,570 | 6,847,961 | 10/685,523 | 10/685,583 | 7,162,442 | 10/685,584 |
| 7,159,784 | 10/804,034 | 10/793,933 | 6,889,896 | 10/831,232 | 7,174,056 | 6,996,274 |
| 7,162,088 | 10/943,874 | 10/943,872 | 10/944,044 | 7,259,884 | 10/944,043 | 7,167,270 |
| 10/943,877 | 6,986,459 | 10/954,170 | 7,181,448 | 10/981,626 | 10/981,616 | 7,324,989 |
| 7,231,293 | 7,1743,29 | 10/992,713 | 7,295,922 | 7,200,591 | 11/020,106 | 11/020,260 |
| 11/020,321 | 11/020,319 | 11/026,045 | 11/059,696 | 11/051,032 | 11/059,674 | 11/107,944 |
| 11/107,941 | 11/082,940 | 11/082,815 | 11/082,827 | 11/082,829 | 6,991,153 | 6,991,154 |
| 11/124,256 | 11/123,136 | 11/154,676 | 7,322,524 | 11/182,002 | 11/202,251 | 11/202,252 |
| 11/202,253 | 11/203,200 | 11/202,218 | 11/206,778 | 11/203,424 | 11/222,977 | 7,327,485 |
| 11/227,239 | 11/286,334 | 7,225,402 | 11/329,187 | 11/349,143 | 11/491,225 | 11/491,121 |
| 11/442,428 | 11/454,902 | 11/442,385 | 11/478,590 | 7,271,931 | 11/520,170 | 11/603,057 |
| 11/706,964 | 11/739,032 | 11/739,014 | 7,336,389 | 11/830,848 | 11/830,849 | 11/839,542 |
| 11/866,394 | 11/934,077 | 11/951,874 | 12/015,487 | 12/023,860 | 12/023,005 | 12/036,266 |
| 7,068,382 | 7,068,382 | 7,007,851 | 6,957,921 | 6,457,883 | 10/743,671 | 7,044,381 |
| 11/203,205 | 7,094,910 | 7,091,344 | 7,122,685 | 7,038,066 | 7,099,019 | 7,062,651 |
| 7,062,651 | 6,789,194 | 6,789,194 | 6,789,191 | 6,789,191 | 10/900,129 | 7,278,018 |
| 10/913,350 | 10/982,975 | 10/983,029 | 11/331,109 | 6,644,642 | 6,644,642 | 6,502,614 |
| 6,502,614 | 6,622,999 | 6,622,999 | 6,669,385 | 6,669,385 | 6,827,116 | 7,011,128 |
| 10/949,307 | 6,549,935 | 6,549,935 | 6,987,573 | 6,987,573 | 6,727,996 | 6,727,996 |
| 6,591,884 | 6,591,884 | 6,439,706 | 6,439,706 | 6,760,119 | 6,760,119 | 7,295,332 |
| 7,295,332 | 7,064,851 | 6,826,547 | 6,290,349 | 6,290,349 | 6,428,155 | 6,428,155 |
| 6,785,016 | 6,785,016 | 6,831,682 | 6,741,871 | 6,927,871 | 6,980,306 | 6,965,439 |
| 6,840,606 | 7,036,918 | 6,977,746 | 6,970,264 | 7,068,389 | 7,093,991 | 7,190,491 |
| 10/901,154 | 10/932,044 | 10/962,412 | 7,177,054 | 10/962,552 | 10/965,733 | 10/965,933 |
| 10/974,742 | 10/982,974 | 7,180,609 | 10/986,375 | 11/107,817 | 7,292,363 | 11/149,160 |
| 11/206,756 | 11/250,465 | 7,202,959 | 11/653,219 | 11/706,309 | 11/730,389 | 11/730,392 |
| 60/953,443 | 11/866,387 | 60/974,077 | 6,982,798 | 6,870,966 | 6,870,966 | 6,822,639 |
| 6,822,639 | 6,474,888 | 6,627,870 | 6,724,374 | 6,788,982 | 7,263,270 | 6,788,293 |
| 6,946,672 | 6,737,591 | 6,737,591 | 7,091,960 | 09/693,514 | 6,792,165 | 7,105,753 |
| 6,795,593 | 6,980,704 | 6,768,821 | 7,132,612 | 7,041,916 | 6,797,895 | 7,015,901 |
| 7,289,882 | 7,148,644 | 10/778,056 | 10/778,058 | 10/778,060 | 10/778,059 | 10/778,063 |
| 10/778,062 | 10/778,061 | 10/778,057 | 7,096,199 | 7,286,887 | 10/917,467 | 10/917,466 |
| 7,324,859 | 7,218,978 | 7,245,294 | 7,277,085 | 7,187,370 | 10/917,436 | 10/943,856 |
| 10/919,379 | 7,019,319 | 10/943,878 | 10/943,849 | 7,043,096 | 7,148,499 | 11/144,840 |
| 11/155,556 | 11/155,557 | 11/193,481 | 11/193,435 | 11/193,482 | 11/193,479 | 7,336,267 |
| 11/281,671 | 11/298,474 | 7,245,760 | 11/488,832 | 11/495,814 | 11/495,823 | 11/495,822 |
| 11/495,821 | 11/495,820 | 11/653,242 | 11/754,370 | 60/911,260 | 11/829,936 | 11/839,494 |
| 11/866,305 | 11/866,313 | 11/866,324 | 11/866,336 | 11/866,348 | 11/866,359 | 11/970,951 |
| 12/036,264 | 7,055,739 | 7,055,739 | 7,233,320 | 7,233,320 | 6,830,196 | 6,830,196 |
| 6,832,717 | 6,832,717 | 7,182,247 | 7,120,853 | 7,082,562 | 6,843,420 | 10/291,718 |
| 6,789,731 | 7,057,608 | 6,766,944 | 6,766,945 | 7,289,103 | 10/291,559 | 7,299,969 |
| 7,264,173 | 10/409,864 | 7,108,192 | 10/537,159 | 7,111,791 | 7,077,333 | 6,983,878 |
| 10/786,631 | 7,134,598 | 10/893,372 | 6,929,186 | 6,994,264 | 7,017,826 | 7,014,123 |
| 7,134,601 | 7,150,396 | 10/971,146 | 7,017,823 | 7,025,276 | 7,284,701 | 10/780,780 |
| 11/074,802 | 7,334,739 | 11/749,158 | 11/842,948 | 12/015,477 | 12/025,746 | 12/025,747 |
| 12/025,748 | 12/025,749 | 12/025,750 | 12/025,751 | 12/025,754 | 12/025,756 | 12/025,757 |
| 12/025,759 | 12/025,760 | 12/025,761 | 12/025,762 | 12/025,764 | 12/025,765 | 12/025,766 |
| 12/025,767 | 12/025,768 | 10/492,169 | 10/492,152 | 10/492,168 | 10/492,161 | 7,308,148 |
| 10/502,575 | 10/531,229 | 10/683,151 | 10/531,733 | 10/683,040 | 10/510,391 | 10/919,260 |

-continued

| | | | | | | |
|---|---|---|---|---|---|---|
| 10/510,392 | 10/778,090 | 11/944,404 | 11/936,638 | 12/031,615 | 6,957,768 | 6,957,768 |
| 09/575,172 | 09/575172 | 7,170,499 | 7,170,499 | 7,106,888 | 7,106,888 | 7,123,239 |
| 7,123,239 | 6,982,701 | 6,982,703 | 7,227,527 | 6,786,397 | 6,947,027 | 6,975,299 |
| 7,139,431 | 7,048,178 | 7,118,025 | 6,839,053 | 7,015,900 | 7,010,147 | 7,133,557 |
| 6,914,593 | 10/291,546 | 6,938,826 | 7,278,566 | 7,123,245 | 6,992,662 | 7,190,346 |
| 11/074,800 | 11/074,782 | 11/074,777 | 11/075,917 | 7,221,781 | 11/102,843 | 7,213,756 |
| 11/188,016 | 7,180,507 | 7,263,225 | 7,287,688 | 11/737,094 | 11/753,570 | 11/782,596 |
| 11/865,711 | 12/036,904 | 11/856,061 | 11/856,062 | 11/856,064 | 11/856,066 | 11/672,522 |
| 11/672,950 | 11/672,947 | 11/672,891 | 11/672,954 | 11/672,533 | 11/754,310 | 11/754,321 |
| 11/754,320 | 11/754,319 | 11/754,318 | 11/754,317 | 11/754,316 | 11/754,315 | 11/754,314 |
| 11/754,313 | 11/754,312 | 11/754,311 | 12/015,507 | 12/015,508 | 12/015,509 | 12/015,510 |
| 12/015,511 | 12/015,512 | 12/015,513 | 6,593,166 | 7,132,679 | 6,940,088 | 7,119,357 |
| 7,307,272 | 6,755,513 | 6,974,204 | 6,409,323 | 7,055,930 | 6,281,912 | 6,893,109 |
| 6,604,810 | 6,824,242 | 6,318,920 | 7,210,867 | 6,488,422 | 6,655,786 | 6,457,810 |
| 6,485,135 | 6,796,731 | 6,904,678 | 6,641,253 | 7,125,106 | 6,786,658 | 7,097,273 |
| 6,824,245 | 7,222,947 | 6,918,649 | 6,860,581 | 6,929,351 | 7,063,404 | 6,969,150 |
| 7,004,652 | 6,871,938 | 6,905,194 | 6,846,059 | 6,997,626 | 7,303,256 | 7,029,098 |
| 6,966,625 | 7,114,794 | 7,207,646 | 7,077,496 | 7,284,831 | 11/072,529 | 7,152,938 |
| 7,182,434 | 7,182,430 | 7,306,317 | 7,032,993 | 7,325,905 | 11/155,545 | 11/144,813 |
| 7,172,266 | 7,258,430 | 7,128,392 | 7,210,866 | 7,306,322 | 11/505,933 | 11/540,727 |
| 11/635,480 | 11/707,946 | 11/706,303 | 11/709,084 | 11/730,776 | 11/744,143 | 11/779,845 |
| 11/782,589 | 11/863,256 | 11/940,302 | 11/940,235 | 11/955,359 | 12/019,583 | 12/019,566 |
| 12/036,910 | 11/066,161 | 11/066,160 | 11/066,159 | 11/066,158 | 7,287,831 | 11/875,936 |
| 12/017,818 | 6,804,030 | 6,807,315 | 6,771,811 | 6,683,996 | 7,271,936 | 7,304,771 |
| 6,965,691 | 7,058,219 | 7,289,681 | 7,187,807 | 7,181,063 | 11/338,783 | 11/603,823 |
| 11/650,536 | 12/025,633 | 10/727,181 | 10/727,162 | 10/727,163 | 10/727,245 | 7,121,639 |
| 7,165,824 | 7,152,942 | 10/727,157 | 7,181,572 | 7,096,137 | 7,302,592 | 7,278,034 |
| 7,188,282 | 10/727,159 | 10/727,180 | 10/727,179 | 10/727,192 | 10/727,274 | 10/727,164 |
| 10/727,161 | 10/727,198 | 10/727,158 | 10/754,536 | 10/727,938 | 10/727,227 | 10/727,160 |
| 10/934,720 | 7,171,323 | 7,278,697 | 11/442,131 | 11/474,278 | 11/488,853 | 7,328,115 |
| 11/749,750 | 11/749,749 | 11/955,127 | 11/951,213 | 10/296,522 | 6,795,215 | 7,070,098 |
| 7,154,638 | 6,805,419 | 6,859,289 | 6,977,751 | 6,398,332 | 6,394,573 | 6,622,923 |
| 6,747,760 | 6,921,144 | 10/884,881 | 7,092,112 | 7,192,106 | 11/039,866 | 7,173,739 |
| 6,986,560 | 7,008,033 | 11/148,237 | 7,222,780 | 7,270,391 | 7,150,510 | 11/478,599 |
| 11/499,749 | 11/521,388 | 11/738,518 | 11/482,981 | 11/743,662 | 11/743,661 | 11/743,659 |
| 11/743,655 | 11/743,657 | 11/752,900 | 11/926,109 | 11/927,163 | 11/929,567 | 7,195,328 |
| 7,182,422 | 11/650,537 | 11/712,540 | 10/854,521 | 10/854,522 | 10/854,488 | 7,281,330 |
| 10/854,503 | 10/854,504 | 10/854,509 | 7,188,928 | 7,093,989 | 10/854,497 | 10/854,495 |
| 10/854,498 | 10/854,511 | 10/854,512 | 10/854,525 | 10/854,526 | 10/854,516 | 7,252,353 |
| 10/854,515 | 7,267,417 | 10/854,505 | 10/854,493 | 7,275,805 | 7,314,261 | 10/854,490 |
| 7,281,777 | 7,290,852 | 10/854,528 | 10/854,523 | 10/854,527 | 10/854,524 | 10/854,520 |
| 10/854,514 | 10/854,519 | 10/854,513 | 10/854,499 | 10/854,501 | 7,266,661 | 7,243,193 |
| 10/854,518 | 10/854,517 | 10/934,628 | 7,163,345 | 7,322,666 | 11/601,757 | 11/706,295 |
| 11/735,881 | 11/748,483 | 11/749,123 | 11/766,061 | 11/775,135 | 11/772,235 | 11/778,569 |
| 11/829,961 | 11/870,342 | 11/935,274 | 11/937,239 | 11/961,907 | 11/961,940 | 11/961,961 |
| 11/014,731 | D529081 | D541848 | D528597 | 6,924,907 | 6,712,452 | 6,416,160 |
| 6,238,043 | 6,958,826 | 6,812,972 | 6,553,459 | 6,967,741 | 6,956,669 | 6,903,766 |
| 6,804,026 | 7,259,889 | 6,975,429 | 10/636,234 | 10/636,233 | 7,301,567 | 10/636,216 |
| 7,274,485 | 7,139,084 | 7,173,735 | 7,068,394 | 7,286,182 | 7,086,644 | 7,250,977 |
| 7,146,281 | 7,023,567 | 7,136,183 | 7,083,254 | 6,796,651 | 7,061,643 | 7,057,758 |
| 6,894,810 | 6,995,871 | 7,085,010 | 7,092,126 | 7,123,382 | 7,061,650 | 10/853,143 |
| 6,986,573 | 6,974,212 | 7,307,756 | 7,173,737 | 10/954,168 | 7,246,868 | 11/065,357 |
| 7,137,699 | 11/107,798 | 7,148,994 | 7,077,497 | 11/176,372 | 7,248,376 | 11/225,158 |
| 7,306,321 | 7,173,729 | 11/442,132 | 11/478,607 | 11/503,085 | 11/545,502 | 11/583,943 |
| 11/585,946 | 11/653,239 | 11/653,238 | 11/764,781 | 11/764,782 | 11/779,884 | 11/8456,66 |
| 11/872,637 | 11/944,401 | 11/940,215 | 11/544,764 | 11/544,765 | 11/544,772 | 11/544,773 |
| 11/544,774 | 11/544,775 | 11/544,776 | 11/544,766 | 11/544,767 | 11/544,771 | 11/544,770 |
| 11/544,769 | 11/544,777 | 11/544,768 | 11/544,763 | 11/293,804 | 11/293,840 | 11/293,803 |
| 11/293,833 | 11/293,834 | 11/293,835 | 11/293,836 | 11/293,837 | 11/293,792 | 11/293,794 |
| 11/293,839 | 11/293,826 | 11/293,829 | 11/293,830 | 11/293,827 | 11/293,828 | 7,270,494 |
| 11/293,823 | 11/293,824 | 11/293,831 | 11/293,815 | 11/293,819 | 11/293,818 | 11/293,817 |
| 11/293,816 | 11/838,875 | 11/482,978 | 11/640,356 | 11/640,357 | 11/640,358 | 11/640,359 |
| 11/640,360 | 11/640,355 | 11/679,786 | 11/872,714 | 10/760,254 | 10/760,210 | 10/760,202 |
| 7,201,468 | 10/760,198 | 10/760,249 | 7,234,802 | 7,303,255 | 7,287,846 | 7,156,511 |
| 10/760,264 | 7,258,432 | 7,097,291 | 10/760,222 | 10/760,248 | 7,083,273 | 10/760,192 |
| 10/760,203 | 10/760,204 | 10/760,205 | 10/760,206 | 10/760,267 | 10/760,270 | 7,198,352 |
| 10/760,271 | 7,303,251 | 7,201,470 | 7,121,655 | 7,293,861 | 7,232,208 | 7,328,985 |
| 10/760,261 | 7,083,272 | 7,261,400 | 11/474,272 | 11/474,315 | 7,311,387 | 11/583,874 |
| 7,303,258 | 11/706,322 | 11/706,968 | 11/749,119 | 11/749,157 | 11/779,848 | 11/782,590 |
| 11/855,152 | 11/855,151 | 11/870,327 | 11/934,780 | 11/935,992 | 11/951,193 | 12/017,327 |
| 12/015,273 | 12/036,882 | 11/014,764 | 11/014,763 | 7,331,663 | 11/014,747 | 7,328,973 |
| 11/014,760 | 11/014,757 | 7,303,252 | 7,249,822 | 11/014,762 | 7,311,382 | 11/014,723 |
| 11/014,756 | 11/014,736 | 11/014,759 | 11/014,758 | 11/014,725 | 7,331,660 | 11/014,738 |
| 11/014,737 | 7,322,684 | 7,322,685 | 7,311,381 | 7,270,405 | 7,303,268 | 11/014,735 |
| 11/014,734 | 11/014,719 | 11/014,750 | 11/014,749 | 11/758,640 | 11/775,143 |
| 11/838,877 | 11/944,453 | 11/944,633 | 11/955,065 | 12/003,952 | 12/007,818 | 12/007,817 |
| 12/071,187 | 11/014,769 | 11/014,729 | 7,331,661 | 11/014,733 | 7,300,140 | 11/014,755 |
| 11/014,765 | 11/014,766 | 11/014,740 | 7,284,816 | 7,284,845 | 7,255,430 | 11/014,744 |
| 7,328,984 | 11/014,768 | 7,322,671 | 11/014,718 | 11/014,717 | 11/014,716 | 11/014,732 |

-continued

| | | | | | | |
|---|---|---|---|---|---|---|
| 11/014,742 | 11/097,268 | 11/097,185 | 11/097,184 | 11/778,567 | 11/852,958 | 11/852,907 |
| 11/872,038 | 11/955,093 | 11/961,578 | 12/022,023 | 12/023,000 | 12/023,018 | 12/031,582 |
| 12/043,708 | 11/293,820 | 11/293,813 | 11/293,822 | 11/293,812 | 11/293,821 | 11/293,814 |
| 11/293,793 | 11/293,842 | 11/293,811 | 11/293,807 | 11/293,806 | 11/293,805 | 11/293,810 |
| 11/688,863 | 11/688,864 | 11/688,865 | 11/688,866 | 11/688,867 | 11/688,868 | 11/688,869 |
| 11/688,871 | 11/688,872 | 11/688,873 | 11/741,766 | 12/014,767 | 12/014,768 | 12/014,769 |
| 12/014,770 | 12/014,771 | 12/014,772 | 12/014,773 | 12/014,774 | 12/014,775 | 12/014,776 |
| 12/014,777 | 12/014,778 | 12/014,779 | 12/014,780 | 12/014,781 | 12/014,782 | 12/014,783 |
| 12/014,784 | 12/014,785 | 12/014,787 | 12/014,788 | 12/014,789 | 12/014,790 | 12/014,791 |
| 12/014,792 | 12/014,793 | 12/014,794 | 12/014,796 | 12/014,798 | 12/014,801 | 12/014,803 |
| 12/014,804 | 12/014,805 | 12/014,806 | 12/014,807 | 61/034,147 | 11/482,982 | 11/482,983 |
| 11/482,984 | 11/495,818 | 11/495,819 | 11/677,049 | 11/677,050 | 11/677,051 | 11/872,719 |
| 11/872,718 | 61/033,357 | 7,306,320 | 11/934,781 | D528156 | 10/760,180 | 7,111,935 |
| 10/760,213 | 10/760,219 | 10/760,237 | 7,261,482 | 10/760,220 | 7,002,664 | 10/760,252 |
| 10/760,265 | 7,088,420 | 11/446,233 | 11/503,083 | 11/503,081 | 11/516,487 | 11/599,312 |
| 6,364,451 | 6,533,390 | 6,454,378 | 7,224,478 | 6,559,969 | 6,896,362 | 7,057,760 |
| 6,982,799 | 11/202,107 | 11/743,672 | 11/744,126 | 11/743,673 | 7,093,494 | 7,143,652 |
| 7,089,797 | 7,159,467 | 7,234,357 | 7,124,643 | 7,121,145 | 7,089,790 | 7,194,901 |
| 6,968,744 | 7,089,798 | 7,240,560 | 7,137,302 | 11/442,177 | 7,171,855 | 7,260,995 |
| 7,260,993 | 7,165,460 | 7,222,538 | 7,258,019 | 11/543,047 | 7,258,020 | 11/604,324 |
| 7,334,480 | 11/706,305 | 11/707,056 | 11/744,211 | 11/767,526 | 11/779,846 | 11/764,227 |
| 11/829,943 | 11/829,944 | 12/015,390 | 12/031,475 | 6,454,482 | 6,808,330 | 6,527,365 |
| 6,474,773 | 6,550,997 | 7,093,923 | 6,957,923 | 7,131,724 | 10/949,288 | 7,168,867 |
| 7,125,098 | 11/706,966 | 11/185,722 | 7,249,901 | 7,188,930 | 11/014,728 | 11/014,727 |
| D536031 | D531214 | 7,237,888 | 7,168,654 | 7,201,272 | 6,991,098 | 7,217,051 |
| 6,944,970 | 10/760,215 | 7,108,434 | 10/760,257 | 7,210,407 | 7,186,042 | 10/760,266 |
| 6,920,704 | 7,217,049 | 10/760,214 | 10/760,260 | 7,147,102 | 7,287,828 | 7,249,838 |
| 10/760,241 | 10/962,413 | 10/962,427 | 7,261,477 | 7,225,739 | 10/962,402 | 10/962,425 |
| 10/962,428 | 10/962,426 | 10/962,409 | 10/962,417 | 10/962,403 | 7,163,287 |
| 7,258,415 | 7,322,677 | 7,258,424 | 10/962,410 | 7,195,412 | 7,207,670 | 7,270,401 |
| 7,220,072 | 11/474,267 | 11/544,547 | 11/585,925 | 11/593,000 | 11/706,298 | 11/706,296 |
| 11/706,327 | 11/730,760 | 11/730,407 | 11/730,787 | 11/735,977 | 11/736,527 | 11/753,566 |
| 11/754,359 | 11/778,061 | 11/765,398 | 11/778,556 | 11/829,937 | 11/780,470 | 11/866,399 |
| 11/223,262 | 11/223,018 | 11/223,114 | 11/955,366 | 7,322,761 | 11/223,021 | 11/223,020 |
| 11/223,019 | 11/014,730 | D541849 | 29/279,123 | 6,716,666 | 6,949,217 | 6,750,083 |
| 7,014,451 | 6,777,259 | 6,923,524 | 6,557,978 | 6,991,207 | 6,766,998 | 6,967,354 |
| 6,759,723 | 6,870,259 | 10/853,270 | 6,925,875 | 10/898,214 | 7,095,109 | 7,145,696 |
| 10/976,081 | 7,193,482 | 7,134,739 | 7,222,939 | 7,164,501 | 7,118,186 | 7,201,523 |
| 7,226,159 | 7,249,839 | 7,108,343 | 7,154,626 | 7,079,292 | 10/980,184 | 7,233,421 |
| 7,063,408 | 10/983,082 | 10/982,804 | 7,032,996 | 10/982,834 | 10/982,833 | 10/982,817 |
| 7,217,046 | 6,948,870 | 7,195,336 | 7,070,257 | 10/986,813 | 10/986,785 | 7,093,922 |
| 6,988,789 | 10/986,788 | 7,246,871 | 10/992,748 | 10/992,747 | 7,187,468 | 10/992,828 |
| 7,196,814 | 10/992,754 | 7,268,911 | 7,265,869 | 7,128,384 | 7,164,505 | 7,284,805 |
| 7,025,434 | 7,298,519 | 7,280,244 | 7,206,098 | 7,265,877 | 7,193,743 | 7,168,777 |
| 11/006,734 | 7,195,329 | 7,198,346 | 7,281,786 | 11/013,363 | 11/013,881 | 6,959,983 |
| 7,128,386 | 7,097,104 | 11/013,636 | 7,083,261 | 7,070,258 | 7,083,275 | 7,110,139 |
| 6,994,419 | 6,935,725 | 11/026,046 | 7,178,892 | 7,219,429 | 6,988,784 | 11/026,135 |
| 7,289,156 | 11/064,005 | 7,284,976 | 7,178,903 | 7,273,274 | 7,083,256 | 7,325,986 |
| 7,278,707 | 7,325,918 | 6,974,206 | 11/064,004 | 7,066,588 | 7,222,940 | 11/075,918 |
| 7,018,025 | 7,221,867 | 7,290,863 | 7,188,938 | 7,021,742 | 7,083,262 | 7,192,119 |
| 11/083,021 | 7,036,912 | 7,175,256 | 7,182,441 | 7,083,258 | 7,114,796 | 7,147,302 |
| 11/084,757 | 7,219,982 | 7,118,195 | 7,229,153 | 6,991,318 | 7,108,346 | 11/248,429 |
| 11/239,031 | 7,178,899 | 7,066,579 | 11/281,419 | 20060087544 | 11/329,188 | 11/329,140 |
| 7,270,397 | 7,258,425 | 7,237,874 | 7,152,961 | 7,333,235 | 7,207,658 | 11/484,744 |
| 7,311,257 | 7,207,659 | 11/525,857 | 11/540,569 | 11/583,869 | 11/592,985 | 11/585,947 |
| 7,306,307 | 11/604,316 | 11/604,309 | 11/604,303 | 11/643,844 | 7,329,061 | 11/655,940 |
| 11/653,320 | 7,278,713 | 11/706,381 | 11/706,323 | 11/706,963 | 11/713,660 | 7,290,853 |
| 11/696,186 | 11/730,390 | 11/737,139 | 11/737,749 | 11/740,273 | 11/749,122 | 11/754,361 |
| 11/766,043 | 11/764,775 | 11/768,872 | 11/775,156 | 11/779,271 | 11/779,272 | 11/829,938 |
| 11/839,502 | 11/858,852 | 11/862,188 | 11/859,790 | 11/872,618 | 11/923,651 | 11/950,255 |
| 11/930,001 | 11/955,362 | 12/015,368 | 11/965,718 | 6,485,123 | 6,425,657 | 6,488,358 |
| 7,021,746 | 6,712,986 | 6,981,757 | 6,505,912 | 6,439,694 | 6,364,461 | 6,378,990 |
| 6,425,658 | 6,488,361 | 6,814,429 | 6,471,336 | 6,457,813 | 6,540,331 | 6,454,396 |
| 6,464,325 | 6,443,559 | 6,435,664 | 6,412,914 | 6,488,360 | 6,550,896 | 6,439,695 |
| 6,447,100 | 09/900,160 | 6,488,359 | 6,637,873 | 10/485,738 | 6,618,117 | 10/485,737 |
| 6,803,896 | 7,234,801 | 7,044,589 | 7,163,273 | 6,416,154 | 6,547,364 | 10/485,744 |
| 6,644,771 | 7,152,939 | 6,565,181 | 7,325,897 | 6,857,719 | 7,255,414 | 6,702,417 |
| 7,284,843 | 6,918,654 | 7,070,265 | 6,616,271 | 6,652,078 | 6,503,408 | 6,607,263 |
| 7,111,924 | 6,623,108 | 6,698,867 | 6,488,362 | 6,625,874 | 6,921,153 | 7,198,356 |
| 6,536,874 | 6,425,651 | 6,435,667 | 10/509,997 | 6,527,374 | 7,334,873 | 6,582,059 |
| 10/510,152 | 6,513,908 | 7,246,883 | 6,540,332 | 6,547,368 | 7,070,256 | 6,508,546 |
| 10/510,151 | 6,679,584 | 7,303,254 | 6,857,724 | 10/509,998 | 6,652,052 | 10/509,999 |
| 6,672,706 | 10/510,096 | 6,688,719 | 6,712,924 | 6,588,886 | 7,077,508 | 7,207,654 |
| 6,935,724 | 6,927,786 | 6,988,787 | 6,899,415 | 6,672,708 | 6,644,767 | 6,874,866 |
| 6,830,316 | 6,994,420 | 6,954,254 | 7,086,720 | 7,240,992 | 7,267,424 | 7,128,397 |
| 7,084,951 | 7,156,496 | 7,066,578 | 7,101,023 | 11/165,027 | 11/202,235 | 11/225,157 |
| 7,159,965 | 7,255,424 | 11/349,519 | 7,137,686 | 7,201,472 | 7,287,829 | 11/504,602 |
| 7,216,957 | 11/520,572 | 11/583,858 | 11/583,895 | 11/585,976 | 11/635,488 | 7,278,712 |
| 11/706,952 | 11/706,307 | 7,287,827 | 11/944,451 | 11/740,287 | 11/754,367 | 11/758,643 |

-continued

| | | | | | | |
|---|---|---|---|---|---|---|
| 11/778,572 | 11/859,791 | 11/863,260 | 11/874,178 | 11/936,064 | 11/951,983 | 12/015,483 |
| 6,916,082 | 6,786,570 | 10/753,478 | 6,848,780 | 6,966,633 | 7,179,395 | 6,969,153 |
| 6,979,075 | 7,132,056 | 6,832,828 | 6,860,590 | 6,905,620 | 6,786,574 | 6,824,252 |
| 7,097,282 | 6,997,545 | 6,971,734 | 6,918,652 | 6,978,990 | 6,863,105 | 10/780,624 |
| 7,194,629 | 10/791,792 | 6,890,059 | 6,988,785 | 6,830,315 | 7,246,881 | 7,125,102 |
| 7,028,474 | 7,066,575 | 6,986,202 | 7,044,584 | 7,210,762 | 7,032,992 | 7,140,720 |
| 7,207,656 | 7,285,170 | 11/048,748 | 7,008,041 | 7,011,390 | 7,048,868 | 7,014,785 |
| 7,131,717 | 7,284,826 | 7,331,101 | 7,182,436 | 7,104,631 | 7,240,993 | 7,290,859 |
| 11/202,217 | 7,172,265 | 7,284,837 | 7,066,573 | 11/298,635 | 7,152,949 | 7,334,877 |
| 11/442,133 | 7,326,357 | 7,156,492 | 11/478,588 | 7,331,653 | 7,287,834 | 11/525,861 |
| 11/583,939 | 11/545,504 | 7,284,326 | 11/635,485 | 11/730,391 | 11/730,788 | 11/749,148 |
| 11/749,149 | 11/749,152 | 11/749,151 | 11/759,886 | 11/865,668 | 11/874,168 | 11/874,203 |
| 11/971,182 | 12/021,086 | 12/015,441 | 11/965,722 | 6,824,257 | 7,270,475 | 6,971,811 |
| 6,878,564 | 6,921,145 | 6,890,052 | 7,021,747 | 6,929,345 | 6,811,242 | 6,916,087 |
| 6,905,195 | 6,899,416 | 6,883,906 | 6,955,428 | 7,284,834 | 6,932,459 | 6,962,410 |
| 7,033,008 | 6,962,409 | 7,013,641 | 7,204,580 | 7,032,997 | 6,998,278 | 7,004,563 |
| 6,910,755 | 6,969,142 | 6,938,994 | 7,188,935 | 10/959,049 | 7,134,740 | 6,997,537 |
| 7,004,567 | 6,916,091 | 7,077,588 | 6,918,707 | 6,923,583 | 6,953,295 | 6,921,221 |
| 7,001,008 | 7,168,167 | 7,210,759 | 7,337,532 | 7,331,659 | 7,322,680 | 6,988,790 |
| 7,192,120 | 7,168,789 | 7,004,577 | 7,052,120 | 11/123,007 | 6,994,426 | 7,258,418 |
| 7,014,298 | 7,328,977 | 11/177,394 | 7,152,955 | 7,097,292 | 7,207,657 | 7,152,944 |
| 7,147,303 | 7,338,147 | 7,134,608 | 7,264,333 | 7,093,921 | 7,077,590 | 7,147,297 |
| 20060038853 | 11/248,832 | 11/248,428 | 11/248,434 | 7,077,507 | 7,172,672 | 7,175,776 |
| 7,086,717 | 7,101,020 | 11/329,155 | 7,201,466 | 11/330,057 | 7,152,967 | 7,182,431 |
| 7,210,666 | 7,252,367 | 7,287,837 | 11/485,255 | 11/525,860 | 6,945,630 | 7,018,294 |
| 6,910,014 | 6,659,447 | 6,648,321 | 7,082,980 | 6,672,584 | 6,743,551 | 6,830,395 |
| 7,289,727 | 7,001,011 | 6,880,922 | 6,886,915 | 6,644,787 | 6,641,255 | 7,066,580 |
| 6,652,082 | 7,284,833 | 6,666,544 | 6,666,543 | 6,669,332 | 6,984,023 | 6,733,104 |
| 6,644,793 | 6,723,575 | 6,953,235 | 6,663,225 | 7,076,872 | 7,059,706 | 7,185,971 |
| 7,090,335 | 6,854,827 | 6,793,974 | 10/636,258 | 7,222,929 | 6,739,701 | 7,073,881 |
| 7,155,823 | 7,219,427 | 7,008,503 | 6,783,216 | 6,883,890 | 6,857,726 | 10/636,274 |
| 6,641,256 | 6,808,253 | 6,827,428 | 6,802,587 | 6,997,534 | 6,959,982 | 6,959,981 |
| 6,886,917 | 6,969,473 | 6,827,425 | 7,007,859 | 6,802,594 | 6,792,754 | 6,860,107 |
| 6,786,043 | 6,863,378 | 7,052,114 | 7,001,007 | 10/729,151 | 10/729,157 | 6,948,794 |
| 6,805,435 | 6,733,116 | 10/683,006 | 7,008,046 | 6,880,918 | 7,066,574 | 6,983,595 |
| 6,923,527 | 7,275,800 | 7,163,276 | 7,156,495 | 6,976,751 | 6,994,430 | 7,014,296 |
| 7,059,704 | 7,160,743 | 7,175,775 | 7,287,839 | 7,097,283 | 7,140,722 | 11/123,009 |
| 11/123,008 | 7,080,893 | 7,093,920 | 7,270,492 | 7,128,093 | 7,052,113 | 7,055,934 |
| 11/155,627 | 7,278,796 | 11/159,197 | 7,083,263 | 7,145,592 | 7,025,436 | 11/281,444 |
| 7,258,421 | 11/478,591 | 7,332,051 | 7,226,147 | 11/482,940 | 7,195,339 | 11/503,061 |
| 11/505,938 | 7,284,838 | 7,293,856 | 11/544,577 | 11/540,576 | 7,325,901 | 11/592,991 |
| 11/599,342 | 11/600,803 | 11/604,321 | 11/604,302 | 11/635,535 | 11/635,486 | 11/643,842 |
| 11/655,987 | 11/650,541 | 11/706,301 | 11/707,039 | 11/730,388 | 11/730,786 | 11/730,785 |
| 11/739,080 | 7,322,679 | 11/768,875 | 11/779,847 | 11/829,940 | 11/847,240 | 11/834,625 |
| 11/863,210 | 11/865,680 | 11/874,156 | 11/923,602 | 11/951,940 | 11/954,988 | 11/961,662 |
| 12/015,178 | 12/015,157 | 12/017,305 | 12/017,926 | 12/015,261 | 12/025,605 | 12/031,646 |
| 7,067,067 | 6,776,476 | 6,880,914 | 7,086,709 | 6,783,217 | 7,147,791 | 6,929,352 |
| 7,144,095 | 6,820,974 | 6,918,647 | 6,984,016 | 7,192,125 | 6,824,251 | 6,834,939 |
| 6,840,600 | 6,786,573 | 7,144,519 | 6,799,835 | 6,959,975 | 6,959,974 | 7,021,740 |
| 6,935,718 | 6,938,983 | 6,938,991 | 7,226,145 | 7,140,719 | 6,988,788 | 7,022,250 |
| 6,929,350 | 7,011,393 | 7,004,566 | 7,175,097 | 6,948,799 | 7,143,944 | 7,310,157 |
| 7,029,100 | 6,957,811 | 7,073,724 | 7,055,933 | 7,077,490 | 7,055,940 | 10/991,402 |
| 7,234,645 | 7,032,999 | 7,066,576 | 7,229,150 | 7,086,728 | 7,246,879 | 7,284,825 |
| 7,140,718 | 7,284,817 | 7,144,098 | 7,044,577 | 7,284,824 | 7,284,827 | 7,189,334 |
| 7,055,935 | 7,152,860 | 11/203,188 | 11/203,173 | 7,334,868 | 7,213,989 | 11/225,156 |
| 11/225,173 | 7,300,141 | 7,114,868 | 7,168,796 | 7,159,967 | 7,328,966 | 7,152,805 |
| 11/298,530 | 11/330,061 | 7,133,799 | 11/330,054 | 11/329,284 | 7,152,956 | 7,128,399 |
| 7,147,305 | 7,287,702 | 7,325,904 | 7,246,884 | 7,152,960 | 11/442,125 | 11/454,901 |
| 11/442,134 | 11/450,441 | 11/474,274 | 11/499,741 | 7,270,399 | 6,857,728 | 6,857,729 |
| 6,857,730 | 6,989,292 | 7,126,216 | 6,977,189 | 6,982,189 | 7,173,332 | 7,026,176 |
| 6,979,599 | 6,812,062 | 6,886,751 | 10/80,4057 | 10/804,036 | 7,001,793 | 6,866,369 |
| 6,946,743 | 7,322,675 | 6,886,918 | 7,059,720 | 7,306,305 | 10/846,562 | 7,334,855 |
| 10/846,649 | 10/846,627 | 6,951,390 | 6,981,765 | 6,789,881 | 6,802,592 | 7,029,097 |
| 6,799,836 | 7,048,352 | 7,182,267 | 7,025,279 | 6,857,571 | 6,817,539 | 6,830,198 |
| 6,992,791 | 7,038,809 | 6,980,323 | 7,148,992 | 7,139,091 | 6,947,173 | 7,101,034 |
| 6,969,144 | 6,942,319 | 6,827,427 | 6,984,021 | 6,984,022 | 6,869,167 | 6,918,542 |
| 7,007,852 | 6,899,420 | 6,918,665 | 6,997,625 | 6,988,840 | 6,984,080 | 6,845,978 |
| 6,848,687 | 6,840,512 | 6,863,365 | 7,204,582 | 6,921,150 | 7,128,396 | 6,913,347 |
| 7,008,819 | 6,935,736 | 6,991,317 | 7,284,836 | 7,055,947 | 7,093,928 | 7,100,834 |
| 7,270,396 | 7,187,086 | 7,290,856 | 7,032,825 | 7,086,721 | 7,159,968 | 7,010,456 |
| 7,147,307 | 7,111,925 | 11/144,812 | 7,2291,54 | 11/505,849 | 11/520,570 | 7,328,994 |
| 7,341,672 | 11/540,575 | 11/583,937 | 7,278,711 | 7,290,720 | 7,314,266 | 11/635,489 |
| 11/604,319 | 11/635,490 | 11/635,525 | 7,287,706 | 11/706,366 | 11/706,310 | 11/706,308 |
| 11/785,108 | 11/744,214 | 11/744,218 | 11/748,485 | 11/748,490 | 11/764,778 | 11/766,025 |
| 11/834,635 | 11/839,541 | 11/860,420 | 11/865,693 | 11/863,118 | 11/866,307 | 11/866,340 |
| 11/869,684 | 11/869,722 | 11/869,694 | 11/876,592 | 11/945,244 | 11/951,121 | 11/945,238 |
| 11/955,358 | 11/965,710 | 11/962,050 | 12/015,478 | 12/015,423 | 12/015,434 | 12/023,015 |
| 12/030,755 | 12/025,641 | 12/036,279 | 12/031,598 | | | |

BACKGROUND OF THE INVENTION

An integrated circuit fabricated on the silicon wafer is often referred to as a 'die'. For the purposes of this specification, the term die will be used as a reference to an integrated circuit fabricated on a wafer substrate using lithographic the well known etching and deposition techniques commonly used in semiconductor fabrication. Integrated circuit (IC) dies are electrically connected to printed circuit boards by wire bonds. The wire bonds are very thin wires—around 25 to 40 microns in diameter—extending from contact pads along the side of the wafer substrate to contacts on the printed circuit board (PCB). Wire bonding is a widely used electrical interconnection technique because of the speed and accuracy of modern wire bonding machines, commonly referred to as wirebonders.

Wirebonders are automated devices that weld small lengths of wire from conductors on the PCB to the contact pads on an integrated circuit die. Wire is fed through a bonding tool that uses some combination of pressure, heat and/or ultra-sonic energy to attach the wire to the bond pads via a solid phase welding process. The two most common types of wire bonder are referred to as wedge bond and ball bond. These refer to the bonding tool and the configuration of the wire bond itself. With both types of wirebonders, the individual wire bonds extend in an arc from the bond pad on the integrated circuit (IC) die to the conductor on the PCB. This is because wires from the contact pads to the PCB are made longer than necessary to accommodate changes in the gap between the PCB and the bonds pads due to thermal expansion, flex in the components and so on.

To protect and strengthen the wire bonds, they are sealed within a bead of epoxy called encapsulant. The top of the wire arc is often about 300 microns above the contact pads although some wire bonding may extend even higher. As the name suggests, the encapsulant needs to encapsulate the full length of the wire so the encapsulant bead will extend 500 microns to 600 microns proud of the contact pads.

If the die is purely an electronic microprocessor, there is little need to keep close control of the encapsulant bead dimensions. However, if the die is a micro-electro mechanical systems (MEMS) device with an active upper surface, it may be necessary or desirable to bring the active surface of the die onto close proximity with another surface. One such situation applies to inkjet printheads. The proximity of the print media to the nozzle array influences the print quality. Similarly, if a cleaning surface is wiped across the nozzles, the bead of encapsulant can hamper the wiping contact.

Another problems arises because of sides of the encapsulant bead are not straight. One commonly used technique for depositing the encapsulant involves extruding it from a needle directly onto the line of wire bonds. The encapsulant volume and placement on the die is not very accurate. Variations in the pressure from the pump or slight non-uniformities in the speed of the needle cause the side of the bead contacting the active surface to be reasonably crooked. As the side of the bead is not straight, it has to be generously spaced from any active parts on the active surface to comfortably accommodate the perturbations. Spacing the electrical contacts away from the active portions (say for example, inkjet nozzles) of the active surface uses up valuable wafer real estate and reduces the number of dies that can be fabricated from a wafer disc.

In light of the widespread use of inkjet printheads, the invention will be described with specific reference to its application in this field. However, the ordinary worker will appreciate that this is purely illustrative and the invention is equally applicable to other integrated circuits wire bonded to a PCB or other support structure.

SUMMARY OF THE INVENTION

According to a first aspect, the present invention provides a method of profiling a series of wire bonds between a line of contact pads on a die, and a corresponding set of conductors on a supporting structure, the method comprising the steps of:

electrically connecting each of the contact pads on the die to a corresponding conductor on the supporting structure with a respective wire bond, each of the wire bonds extending in an arc from the contact pad to the conductor; and, pushing on each of the wire bonds individually to collapse the arc and plastically deform the wire bond such that the plastic deformation maintains the wire bond in a flatter profile shape.

The strength of the wire bond is known to be relatively small; of the order of 3 to 5 grams force. However, the Applicant's work has found that the wire bond structure is robust enough to withstand a certain degree of work hardening from plastic deformation. The arc of the wire bond can be deformed into a flatter profile without compromising the electrical connection with the PCB. The Applicant's above referenced U.S. Ser. No. 11/860,539 discloses a technique for simultaneously pushing some or all of the wire loops in the line of wire bonds. This so called gang wire pushing technique is effective but further development has shown that individually collapsing each wire bond is more controlled and easier to implement in a high volume manufacturing process.

Preferably, adjacent wire bonds in the line of wire bonds are sequentially pushed. In a further preferred form, the step of forming the line of wire bonds uses a wirebonder that has a bonding tool for moving between the contacts pads and their respective corresponding conductors, and the line of wires bonds are sequentially pushed by a wire engaging structure on the wirebonder. Preferably, the wire engaging structure and the bonding tools are configured for synchronized movement. Preferably, the wire engaging structure pushes the wire bond immediately adjacent the wire bond currently being formed by the bonding tool. Preferably, the wirebonder is a wedge type wirebonder and the bonding tool is a wedge with a wire clamp at a distal end such that during use, the wire clamp holds a piece of wire in contact with one of the contact pads on the die to form a weld connection before moving to the corresponding conductor on the PCB to weld the other end of the wire and formal wire bond, and the wire engaging structure has a wire pushing surface that contacts the wire bond, the wire pushing surface is adjacent to, and 1.0 mm to 1.6 mm behind the wire clamp with respect to the movement of the wedge towards the IC die. In a particularly preferred form, the wire pushing surface is between 50 microns to 400 microns closer to the PCB and the wire clamp. In some embodiments, the line of wire bonds does not extend more than 150 microns above the contact pads of the IC die. In preferred embodiments, the line of wire bonds does not extend more than 50 microns above the contact pads of the IC die. In a particularly preferred form, the wire bonds are attached to the contact pads with a bond strength greater than 3 g force.

Preferably the contact pads are spaced from the corresponding conductors on the PCB by more than 1 mm. In a further preferred form, the contact pads are between 2 mm and 3 mm from the corresponding conductors on the PCB. In some embodiments, the PCB has a support structure and the flex PCB and need to the support structure such that the conductors are adjacent the contact pads on the die. In particular embodiments, the support structure has a chip mounting area for supporting the die, the die having a back surface in contact with the chip mounting area and an active surface opposing the back surface, the active surface having the contact pads, and the chip mounting area being raised relative to the remainder of the support structure such that the contact pads are raised relative to the conductors. In a particularly preferred form, the support structure is a liquid crystal polymer (LCP) molding. Preferably, the active surface has functional elements spaced less than 260 microns from the contacts pads of the die. In a particularly preferred form, the die is an inkjet printhead IC and the functional elements are nozzles through which ink is ejected. In some embodiments, the support structure is a liquid crystal polymer (LCP) molding.

Preferably, the wire bonds are covered in a bead of encapsulant, the bead of encapsulant extending less than 200 microns above the active surface of the die.

Preferably, the wire bonds are covered in a bead of encapsulant, the bead of encapsulant having a profiled surface that is flat, parallel to and spaced less than 100 microns from the active surface.

Preferably, the line of wire bonds are covered in a bead of encapsulant, the bead of encapsulant having a profiled surface that is flat and inclined relative to the active surface.

Preferably, the wire bonds are covered in a bead of encapsulant, the encapsulant being an epoxy material that is thixotropic when uncured.

Preferably, the wire bonds are covered in a bead of encapsulant, the encapsulant being an epoxy material has a viscosity greater than 700 cp when uncured.

In a particular embodiment, the printhead IC is mounted in a printer such that during use the nozzles are less than 100 microns from the paper path.

According to a second aspect, the present invention provides a wirebonder for electrically connecting an integrated circuit die with conductors on a printed circuit board, the wirebonder comprising:

a bonding tool for attaching wire bonds from the integrated circuit die to the conductors of the printed circuit board; and, a wire engaging structure for deforming the wire bonds.

Preferably, the wire engaging structure pushes on the wire bonds to plastically deform them.

Preferably, the wire engaging structure is configured to push the wire bonds onto an adhesive surface positioned between the integrated circuit and the conductors of the printed circuit board.

Preferably, the wire engaging structure is flexible relative to the bonding tool.

Preferably, the wire engaging structure is configured for synchronized movement with the bonding tool.

Preferably, the bonding tool moves from the integrated circuit to the conductors when forming one of the wire bonds and the wire engaging structure has a wire pushing surface positioned 1.0 mm to 1.6 mm behind the bonding tool with respect to its direction of movement when forming the wire bonds.

Preferably, the integrated circuit die is mounted to a supporting surface and the wire pushing surface is 50 microns to 400 microns closer to the supporting surface than the bonding tool. Preferably, the wirebonder is a wedge type wirebonder and the bonding tool is a wedge with a wire clamp at a distal end such that during use, the wire clamp holds a piece of wire in contact with one of the contact pads on the die to form a weld connection before moving to the corresponding conductor on the PCB to weld the other end of the wire and formal wire bond. Preferably, the wire pushing surface is formed from a material that has a hardness less than that of the wire bonds.

Preferably, the wire bonds are formed from lengths of wire with a gauge between 15 microns and 75 microns. In a particularly preferred form, the gauge is about 25 microns.

In some embodiments, the wire bonds attach to respective contact pads on the IC die and the wire bonds do not extend more than 150 microns above the contact pads of the IC die. In preferred embodiments, the line of wire bonds does not extend more than 50 microns above the contact pads of the IC die.

Preferably the contact pads are spaced from the corresponding conductors on the PCB by more than 1 mm. In a further preferred form, the contact pads are between 2 mm and 3 mm from the corresponding conductors on the PCB. In some embodiments, the PCB has a support structure and the flex PCB and need to the support structure such that the conductors are adjacent the contact pads on the die. In particular embodiments, the support structure has a chip mounting area for supporting the die, the die having a back surface in contact with the chip mounting area and an active surface opposing the back surface, the active surface having the contact pads, and the chip mounting area being raised relative to the remainder of the support structure such that the contact pads are raised relative to the conductors. In a particularly preferred form, the support structure is a liquid crystal polymer (LCP) molding. Preferably, the active surface has functional elements spaced less than 260 microns from the contacts pads of the die. In a particularly preferred form, the die is an inkjet printhead IC and the functional elements are nozzles through which ink is ejected. In some embodiments, the support structure is a liquid crystal polymer (LCP) molding.

According to a third aspect, the present invention provides an electronic device comprising:

an integrated circuit die with a plurality of contacts pads;

a printed circuit board with a plurality of conductors corresponding to each of the contact pads respectively;

wire bonds electrically connecting each of the contact pads to the corresponding conductors; and, an adhesive surface positioned between the contacts pads and the corresponding conductors; wherein, the wire bonds are secured to the adhesive surface.

According to a fourth aspect, the present invention provides a method of reducing wire bond loop heights in wire bonds electrically connecting an integrated circuit die with a contact pad to a printed circuit board with a conductor, the method comprising the steps of:

mounting the integrated circuit die such that the contact pad is spaced from the conductor;

positioning an adhesive surface between the contact pad and the conductor on the printed circuit board;

attaching wire to one of the contact pad or the conductor;

drawing the wire towards the other of the contact pad or the conductor;

allowing the wire to contact the adhesive surface; and, attaching the wire to the other of the contact pad of the conductor to form a wire bond adhered to the adhesive surface and a point intermediate its ends.

These aspects of the invention are placed on the realisation that wire bonds can be adhered to an underlying supporting structure without detrimental effects to their bond strength or function. Adhering the wire bonds between their ends provides a reliable and control production in the wire bond loop height. The resulting wire bond heights can be smaller than that achieved by inducing plastic deformation as the individual wire is unable to spring back up when the wire engaging structure disengages. It will be appreciated that plastically deforming a wire bond also involves initially elastically deforming the wire. The elastic deformation is removed when the wire pushing structure is retracted.

The wire bond can be adhered while the bonds are being formed by the wirebonder without any modification to the bonding tool. The applicant has found that wire bond is will typically allow the wire to touch the surface between the die and the conductors on the printed circuit board as the bond is being formed. Once the wire has been welded to the contact pad on the die, the bonding tool draws is towards the conductors on the printed circuit board. As it is drawn across the gap between the die and printed circuit board, the wire drapes downwardly and rests on the underlying surface. The only once the bonding tool has welded the other end of the wire to the conductor, and the wire clamp immediately behind the bonding tool breaks off the feed wire by pulling until tensile failure, does residual tension in the loop cause it to bow upwards. If the wire is brought down to touch an adhesive surface before the ultrasonic weld on the printed circuit board, it is not able to bow upwards.

Preferably, the wire bond is moved into contact with the adhesive surface by a wirebonder is the wire bond is being formed.

Preferably, the adhesive surface is one side of a double-sided adhesive tape. Preferably, the integrated circuit die and the PCB are mounted to a supporting structure such that they are adjacent and spaced from each other. Preferably, the PCB is a flexible PCB and the supporting structure is a liquid crystal polymer (LCP) molding. Preferably, the integrated circuit die is mounted to the supporting structure by a die attach film, and the adhesive surface is provided by a portion of the die attach film.

BRIEF DESCRIPTION OF THE DRAWINGS

Embodiments of the invention will now be described by way of example only with reference to the accompanying drawings, in which.

DETAILED DESCRIPTION OF PREFERRED EMBODIMENTS

Figure 1:
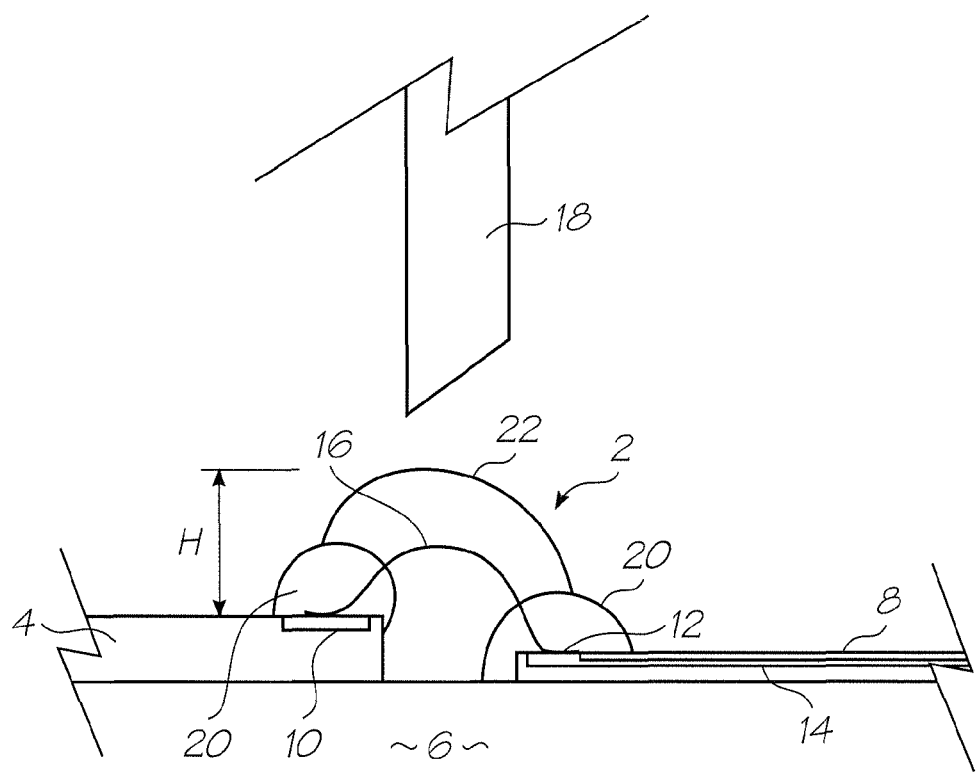
FIG. 1 is a schematic representation of a common prior art technique for applying a bead of encapsulant to wire bonds.

FIG. 1 shows a common technique used for applying a bead encapsulant to wire bonds. A die 4 is mounted to a supporting structure 6 adjacent the edge of a flex PCB 8 (flexible printed circuit board). The die 4 has a line of contact pads 10 along one edge and the flex PCB 8 has corresponding bond pads 12. Wire bonds 16 extend from the bond pads 10 to the bonds pads 12. Power and data is transmitted to the die 4 via conductive traces 14 in the flex PCB 8. This is a simplified representation of the dies mounted within many electronic devices. The printhead IC dies mounted to the LCP (liquid crystal polymer) molding to receive print data from an adjacent flex PCB, as described in U.S. Ser. No. 11/014,769 incorporated herein by cross reference, is one example of this type of die mounting arrangement. The ordinary worker will appreciate that the die may also be mounted directly to a hard PCB with traces formed thereon.

The wire bonds 16 are covered in a bead on encapsulant 2 to protect and reinforce the bonds. The encapsulant 2 is dispensed from a discharge needle 18 directly onto the wire bonds 16. Often the encapsulant bead 2 is three separate beads—two beads of so-called 'dam' encapsulant 20, and one bead of 'fill' encapsulant 22. The dam encapsulant 20 has a higher viscosity than the fill encapsulant 22, and serves to form a channel to hold the fill encapsulant bead. The height H of the bead 2 above the die 4 is usually about 500-600 microns. In most electronic devices, this does not pose a problem. However, if the die has an active surface that needs to operate in close proximity to another surface, this bead can be an obstruction.

Elevating the Die Relative to the Flex PCB

Figure 2:
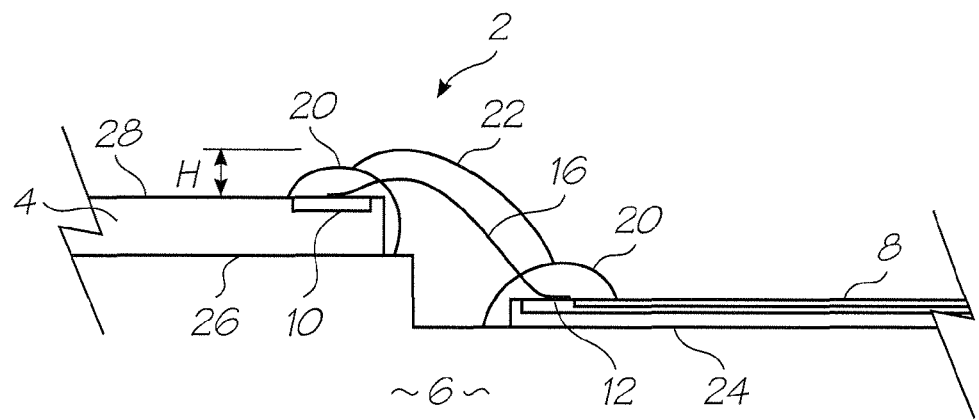
FIG. 2 is a schematic representation of a die mounted to a supporting structure with a chip mounting area raised relative to the flex PCB mounting area.

FIG. 2 shows a stepped support structure 6 that has raised the chip mounting area 26 relative to the PCB mounting area 24 (or at least the area mounting the PCB bonds pads 12). With the die 4 on a raised chip mounting area 26, the arc of the wire bonds 16 are lower relative to active surface 28 of the die 4. In fact, the end of the wire bond 16 attached to the contact pad 10 can be the apex of the arc (bearing in mind that the wire bond arc is intended to accommodate some relative movement of the die and PCB). When the wire bonds 16 are covered with encapsulant 2, the bead has a reduced height H above the active surface 28 of the die 4. If the bead of encapsulant 2 uses two beads of dam encapsulant 24 and a fill encapsulant 22, the positions, volumes and viscosities of the beads need to take the step into account. Bead heights less than 100 microns are easily achievable, and with additional measures, such as wire arc collapsing and bead profiling (discussed below), bead height of less than 50 microns are possible.

With the die 4 raised above the flex PCB 8 by 410 microns, the height of the wire bonds 16 above the die is about 34 microns. With the die raised 610 microns above the flex PCB, the wire bond height is around 20 microns. Raising the die even further has shown little or no further reduction in wire bond height with a step of 710 microns having a wire bond height of around 20 microns.

Shaping the Encapsulant Bead with a Profiling Blade

Figure 3A:
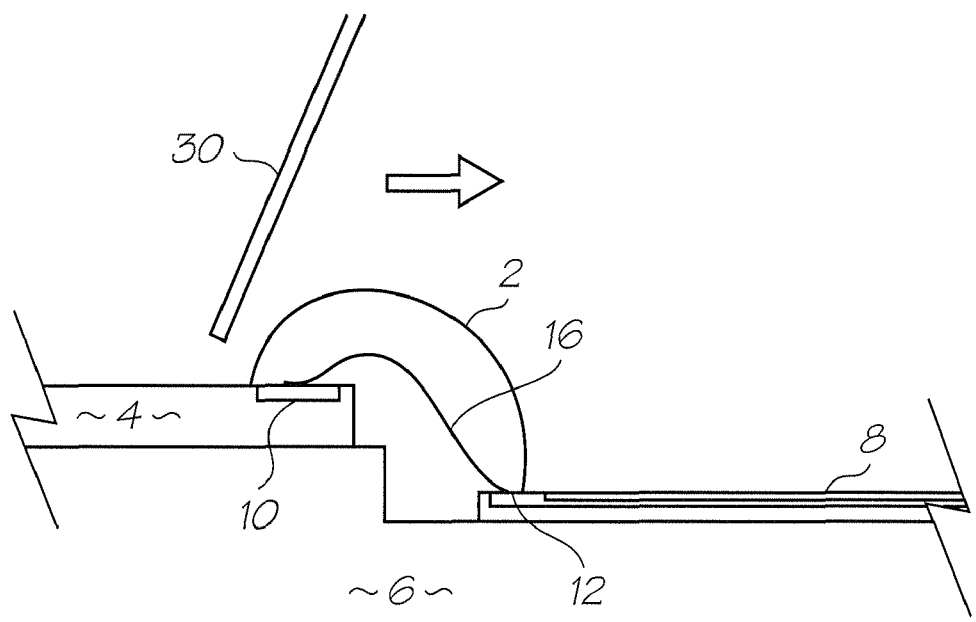
FIGS. 3A, 3B and 3C are schematic representations of the encapsulant bead being profiled into a desired shape using a moveable blade.
Figure 3B:
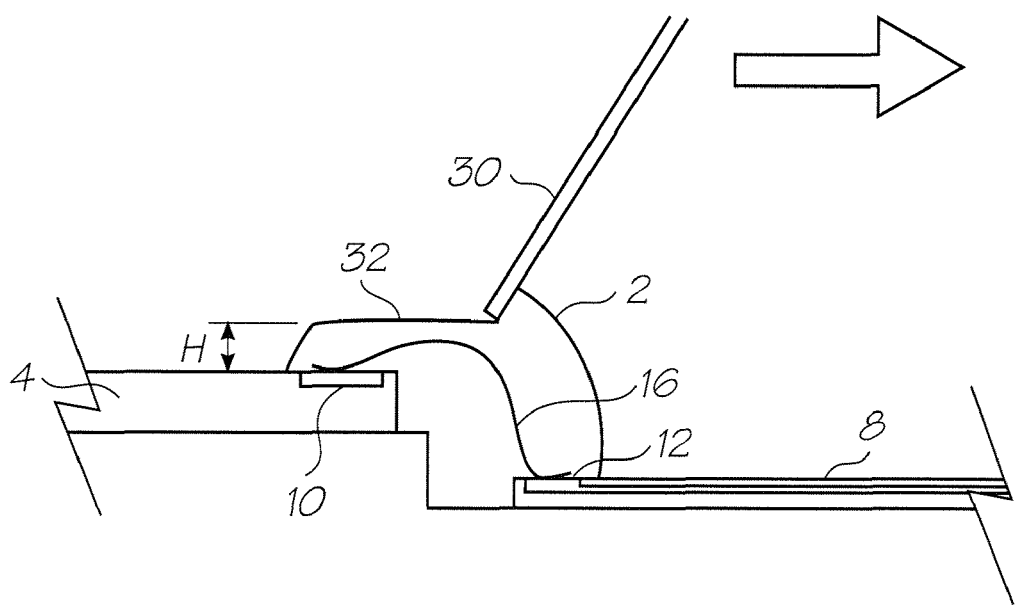
Figure 3C:
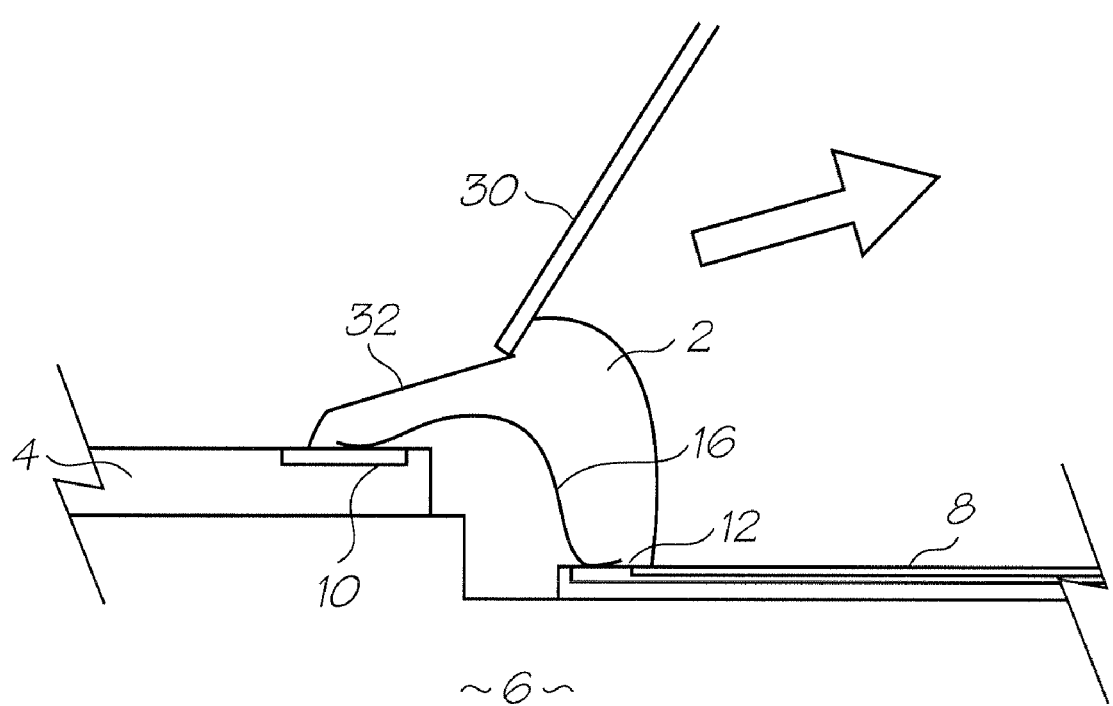

FIGS. 3A to 3C show the encapsulant 2 being profiled with a profiling blade 30. The support structure 6 is again stepped to reduce the height of the wire bonds 16 above the die 4. Before the epoxy encapsulant 2 has cured, the profiling blade 30 moves across the die 4 and wire bonds in a predetermined path. As shown in FIG. 3B, the blade 30 displaces the top of the bead 30 to its flex PCB side to form a flat top surface 32 that is at a significantly reduced height H above the die 4.

The encapsulant bead 2 may be a plurality of separate beads as shown in FIGS. 1 and 2, or a single bead of one material. However, for close dimensional control of the profiled encapsulant, the encapsulant materials used should be thixotropic—that is, once deposited from the discharge needle, or profiled by the blade 30, the material should not flow under its own weight, but rather hold its form until it cures. This requires the epoxy to have an uncured viscosity greater than about 700 cp. A suitable encapsulant is DYMAX 9001-E-v3.1 Chip Encapsulant produced by Dymax Corporation with a viscosity of approximately 800 cp when uncured. The blade 30 may be ceramic (glass) or metal and preferably about 200 microns thick.

It will be appreciated that the relative movement of the blade 30 and the die 4 can be precisely controlled. This allows the height H to be determined by the tolerance of the wire bonding process. As long as H is greater than the nominal height of the wire bond arc above the die, plus the maximum tolerance, the encapsulant 2 will cover and protect the wire bonds 16. With this technique, the height H can be easily reduced from 500-600 microns to less than 300 microns. If the heights of the wire bond arcs are also reduced, the height H of the encapsulant bead can be less than 100 microns. The Applicant uses this technique to profile encapsulant on printhead dies down to a height of 50 microns at its lowest point. As shown in FIG. 3C, the lowest point is at the encapsulant front and the blade 30 forms an inclined face 32 in the top of the bead 2. The inclined face is utilized by the printhead maintenance system when cleaning the paper dust and dried ink from the nozzle face. This illustrates the technique's ability to not just reduce the height of the encapsulant bead, but to form a surface that can perform functions other than just encapsulate the wire bonds. The edge profile of the blade and the path of the blade relative to the die can be configured to form a surface that has a multitude of shapes for a variety of purposes.

Plastic Deformation of the Wire Bond Arcs

Figure 4A:
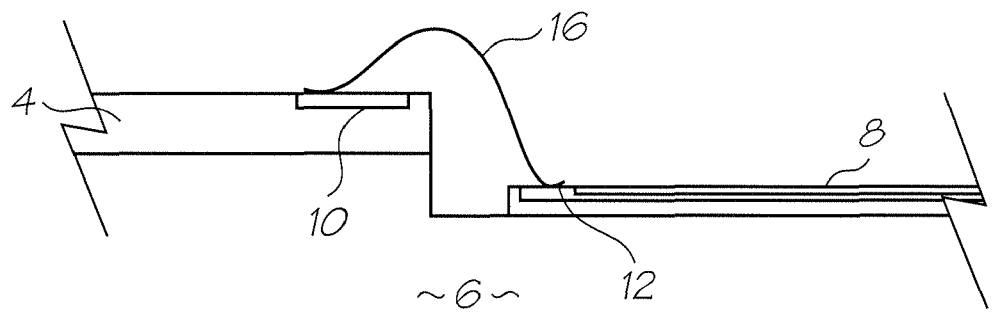
FIGS. 4A to 4D are schematic representations of wire bonds being profiled by plastic deformation.
Figure 4B:
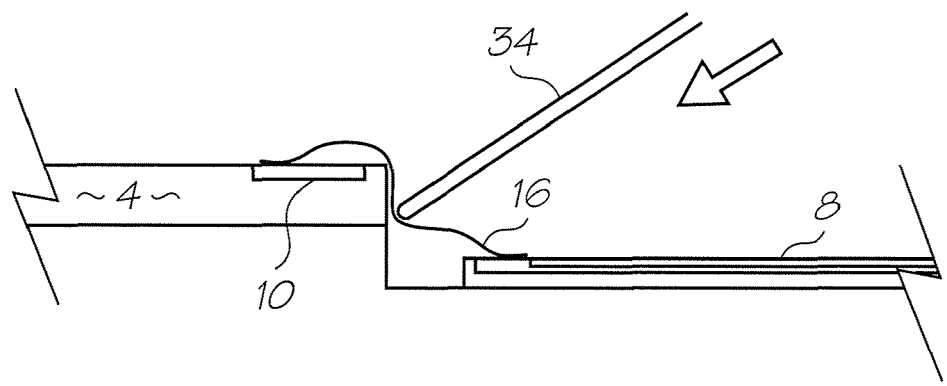
Figure 4C:
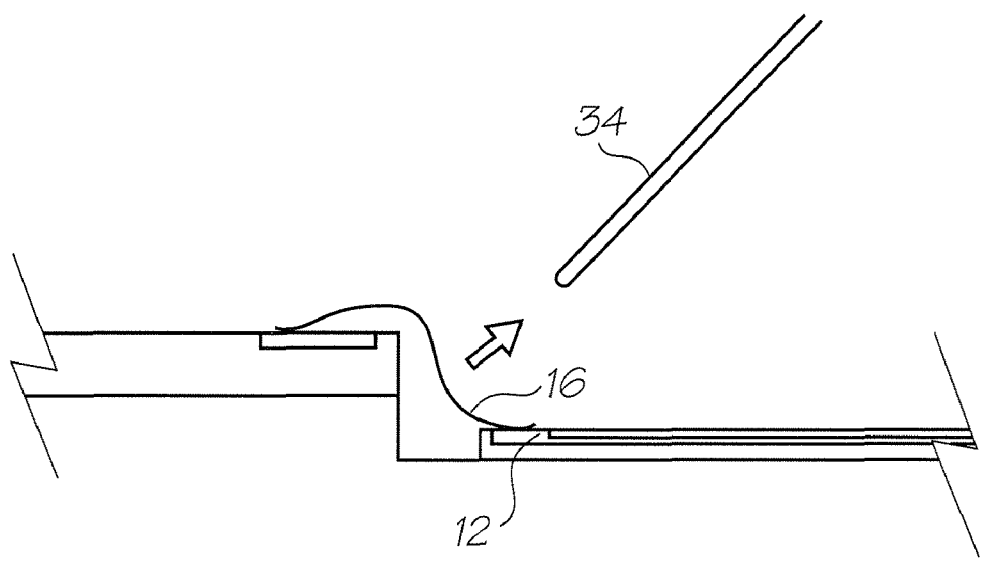

FIGS. 4A to 4C show another technique for lowering the profile of wire bonds. FIG. 4A shows the die 4 connected to the flex PCB 8 via the wire bonds 16. While the stepped support structure 6 has lowered the height of the wire bond arcs compared to a flat supporting structure, the wire bonds still have a natural tendency to bow upwards rather than downwards towards the corner of the step. The wires 16 are typically about 32 microns in diameter and have a pull force of about 3 to 5 grams force. The pull force is the tensile load necessary to break the connection to the contact pad 10 or the bond pad 12. Given the fragility of these structures (one of the reasons encapsulant is applied), conventional wisdom is to avoid any contact between the wire bond arcs and other solid surfaces.

As shown in FIG. 4B, the arc of the wire bonds 16 can be collapsed by a wire pusher 34. The wire pusher 34 displaces the wire bond 16 enough to elastically and plastically deform the arc. The Applicants have shown that contact with the wire pusher 34 can cause localized work hardening in the wire, but as long as the pushing force is not excessive, it does not break. The end of the wire pusher 34 is rounded to avoid stress concentration points. The wire pusher may be a stylus for engaging single wire bonds or a blade that pushes on multiple wire bonds simultaneously.

Referring now to FIG. 4C, the wire pusher 34 is retracted and the wire springs back toward its original shape to relieve the elastic deformation. However, the plastic deformation remains and the wire bond height above the die 4 is much reduced. Testing has shown that an initial wire bond loop height of 200 microns can be reduced to about 35 microns using this technique. Tests have also shown that the pull strength of the plastically deformed wires remains at about 3 to 5 grams force.

The collapse of the wire bonds is uncontrolled and leaves the wire bonds somewhat randomly deformed. However, pushing the wire bonds closer to the die provides more uniformly shaped collapsed wire bonds. The Applicant's work has shown that engaging the wires about 200 to 300 microns for the die provides the best results.

Figure 4D:
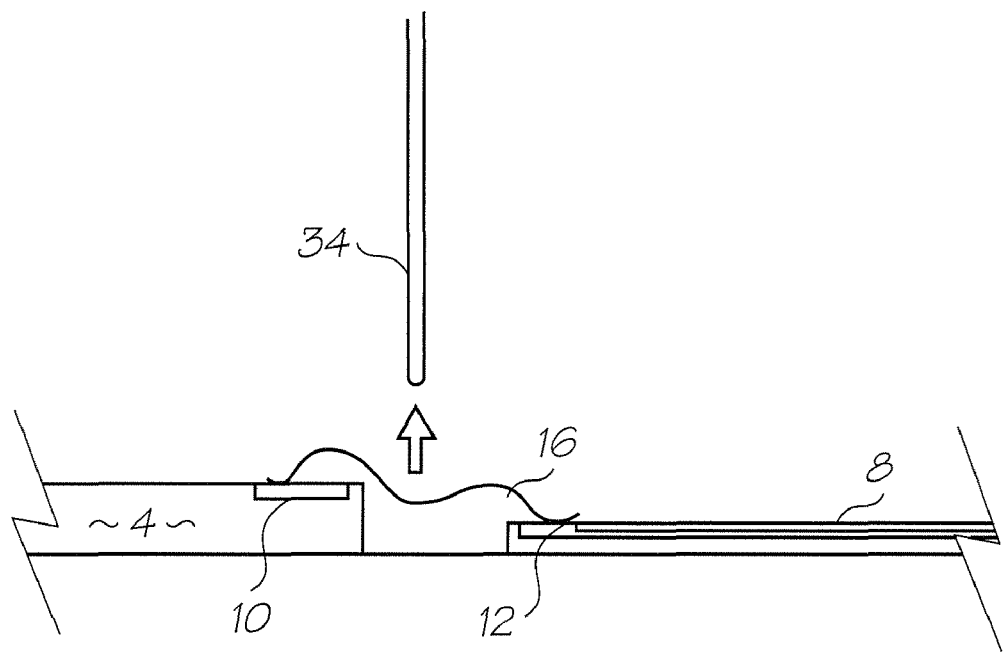

As shown in FIG. 4D, the die 4 and the flex PCB 8 are mounted to a flat support structure 6. As discussed above, this means the original loop height of the wire bond arc is much higher—approximately 400 microns above the die 4. Consequently, the wire has more plastic deformation when the loop is collapsed by the wire pusher. Even so, the Applicants results show that the residual loop height after pushing is about 20-50 microns.

Figure 5A:
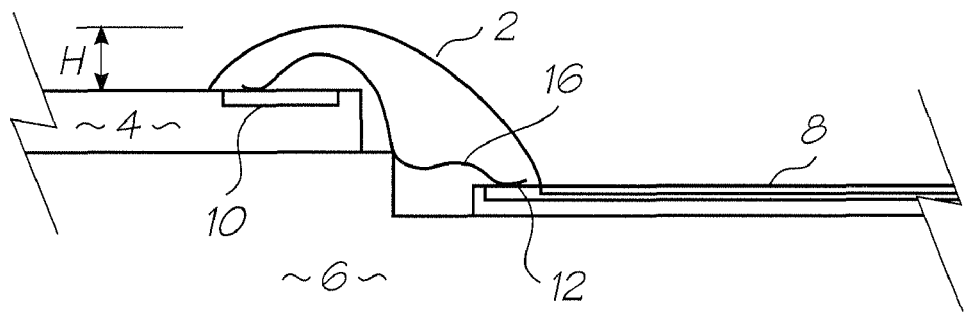
FIGS. 5A and 5B show the encapsulant bead height reductions for plastically deformed wire bonds.
Figure 5B:
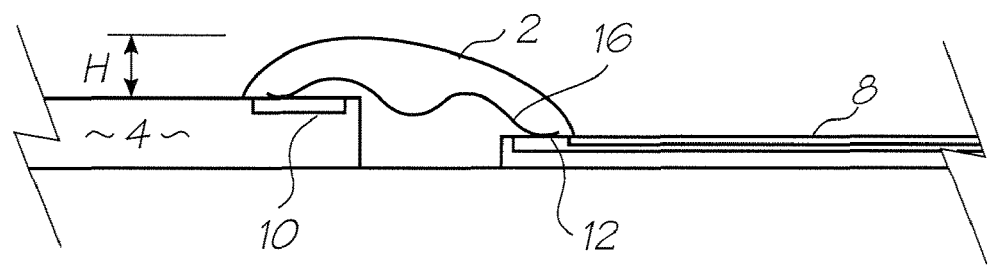

FIGS. 5A and 5B show the collapsed wire bonds 16 covered with an encapsulant bead 2. Even without bead profiling prior to curing, the height H of the bead above the die is much less than the bead necessary to encapsulate the original undeformed wire loops.

Applying Encapsulant with Profiling Blade

Figure 6A:
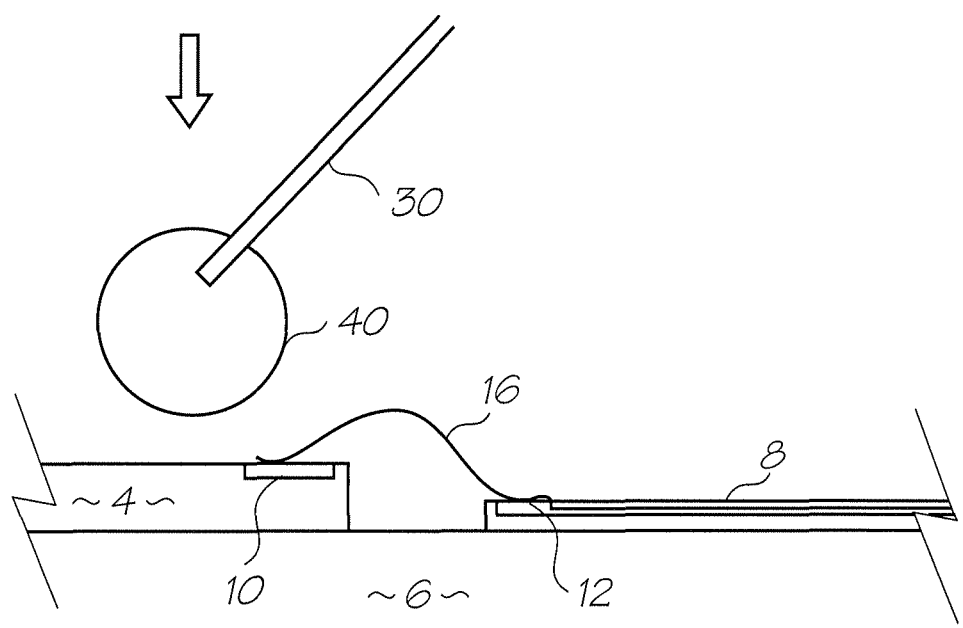
FIGS. 6A to 6C show the encapsulant bead being applied to the wire bonds using the profiling blade.
Figure 6B:
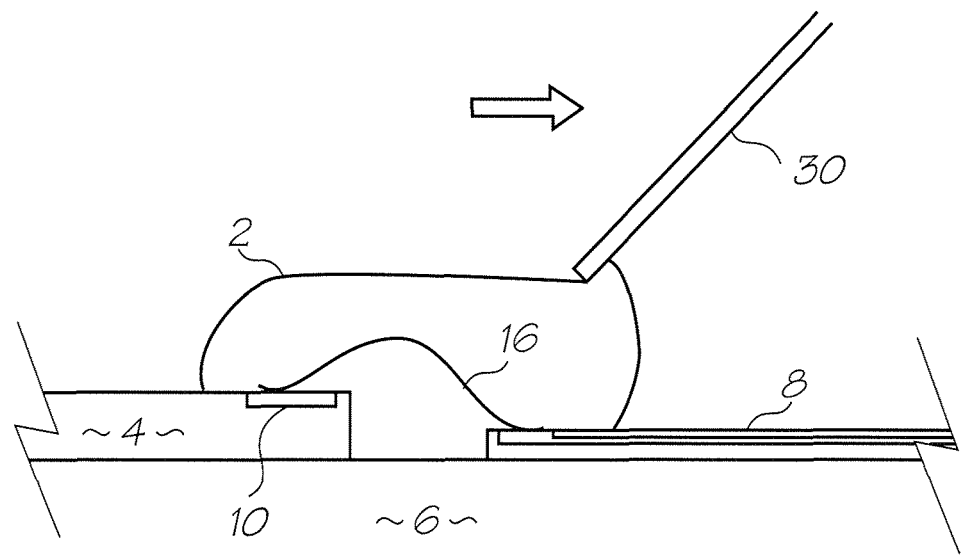
Figure 6C:
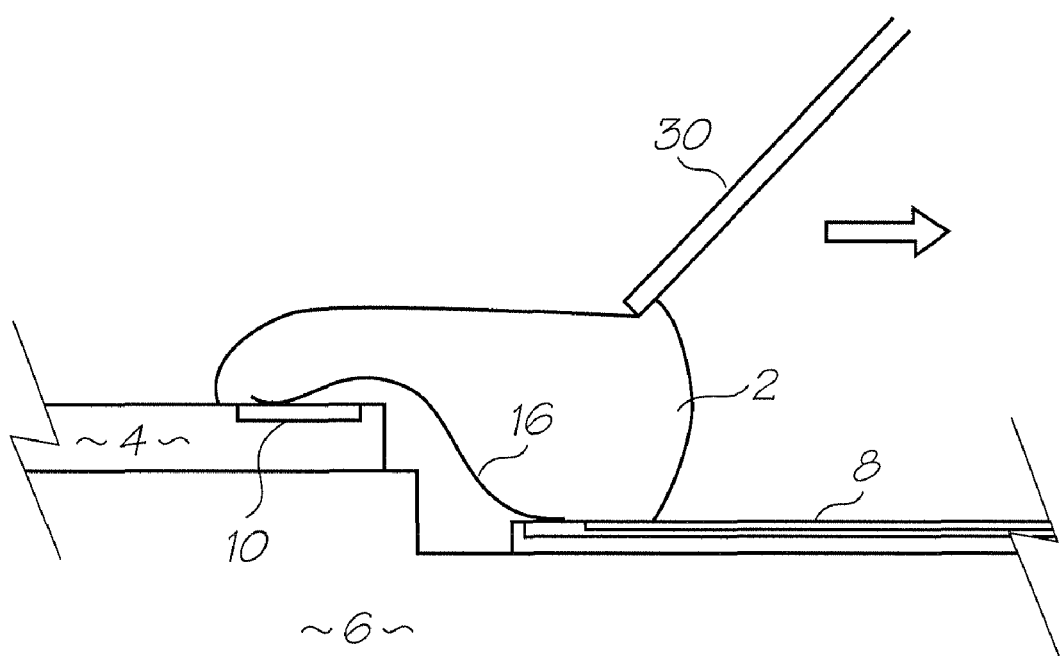

FIGS. 6A, 6B and 6C show the application of the encapsulant bead using the profiling blade 30 instead of a discharge needle (see FIGS. 1 and 2). As previously discussed, the flowrate of encapsulant from the discharge needle can vary and this gives rise to large variations on the position of the encapsulant front on the active surface of the die 4. Consequently, any functional elements in the active surface of the die need to be sufficiently spaced from the contacts pads 10 to allow for the meandering encapsulant front.

Applying the encapsulant with the profiling blade avoids the problems caused by the flowrate fluctuations from the discharge needle. As shown in FIG. 6A, the bead of encapsulant 40 can be formed on the profiling blade 30 by simply dipping it into a reservoir of uncured encapsulant epoxy. Of course, the bead 40 may also be formed by any other convenient method, such as running the discharge needle along one end of the blade 30.

FIG. 6B show the blade 30 having been lowered to touch the bead 40 onto the die 4. When the encapsulant material touches the die surface, it wets and wicks along the surface while remaining pinned to the edge of the blade. The blade 30 is held at a predetermined height above the die 4 and moved over the bead 2 to flatten and lower its profile. The encapsulant displaced from the top of the bead 2 by the blade 30, spreads over the PCB side of the bead 2. It is not relevant if the encapsulant spreads further over the PCB than necessary. As long as the wire bonds 16 and the bonds pads 12 are covered, any additional encapsulant on the PCB 8 surface is not detrimental.

In FIG. 6C, the wire bond 16 height has been reduced by collapsing the arc in accordance with the techniques discussed above. As previously discussed, the bead 2 deposited by the discharge needle need not be as big to cover the wire bond 16 once it has been collapsed. Furthermore, the blade 30 can be brought closer to the die 4 without contacting wire bonds 16 when profiling the encapsulant 2. Hence the bead profile in FIG. 6C is substantially lower than that of FIG. 6B.

Encapsulant Front Control

When the encapsulant material is dispensed from the discharge needle, minor variations in the flowrate can cause the bead to bulge at points of higher flow. Consequently, the side of the bead that contacts the active surface of the die is not straight, but has significant perturbations. These perturbations have to be accommodated between the contact pads and any functional elements on the active surface. The spacing between the contacts pads and the functional elements consumes valuable 'chip real estate'. The Applicant has previously developed printhead dies with a spacing of 260 microns between the contact pads and the first row of nozzles. Better control of the encapsulant front reduces the space between the contacts and operational elements, and so the overall dimensions of the die. Hence the design can be more compact and more chips fabricated from the original wafer disc.

Figure 7A:
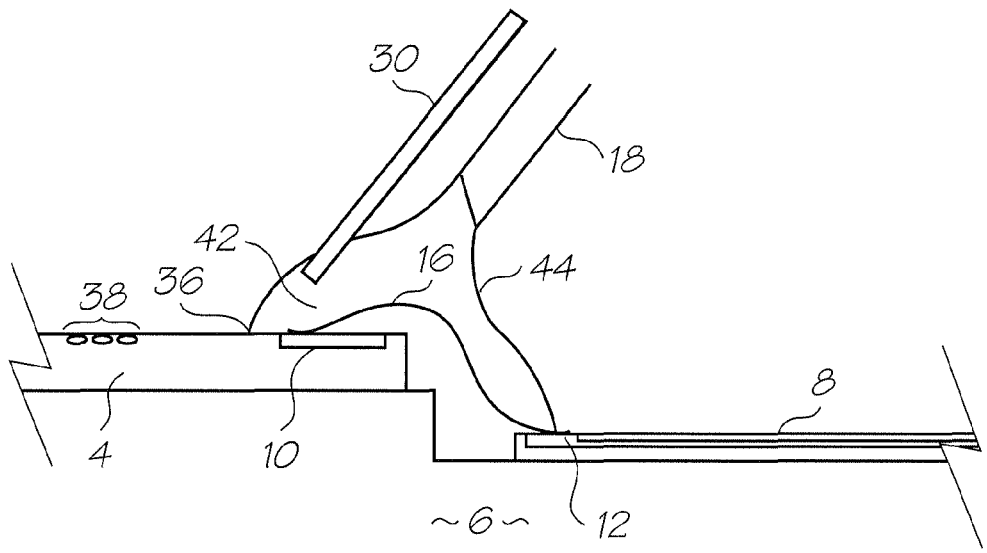
FIGS. 7A and 7B show the profiling blade being used to control the encapsulant bead front on the surface of the die.
Figure 7B:
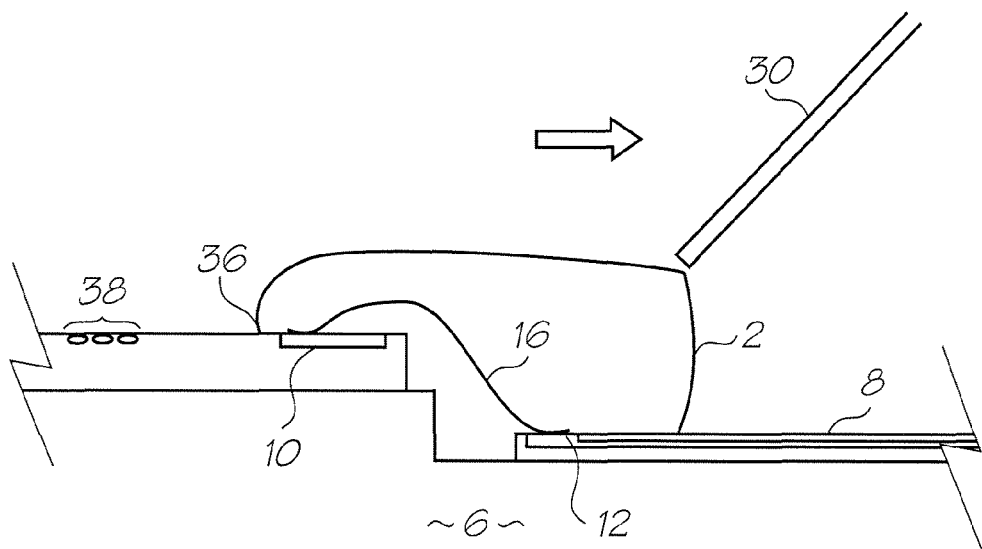

As shown in FIGS. 7A and 7B, the profiling blade 30 is used to control the front 36 of the bead of encapsulant 2. The blade 30 is positioned over the die 4 to define a gap 42 between its lower edge and the active surface 28. As the discharge needle 18 dispenses the encapsulant material 44, it flows onto the active surface, one side of the blade and a fillet of the material extends through the gap 42. Because of the flow restriction created by the gap, flow variations have a reduced effect on the dimensions of the fillet that flows through the gap. Therefore the encapsulant front 36 closely corresponds to the line of the lower edge of the blade 30.

As shown in FIG. 7B, the profiling blade 30 is already in position to profile the encapsulant bead 2 once it has been dispensed from the discharge needle. The blade 30 simply moves over the die 4 in a direction away from the nozzles 38. This keeps the encapsulant front 36 in place and flattens the profile of the encapsulant bead 2 over the wire bonds 16.

Collapsing the Wire Bonds Arcs with the Wirebonder

Figure 8:
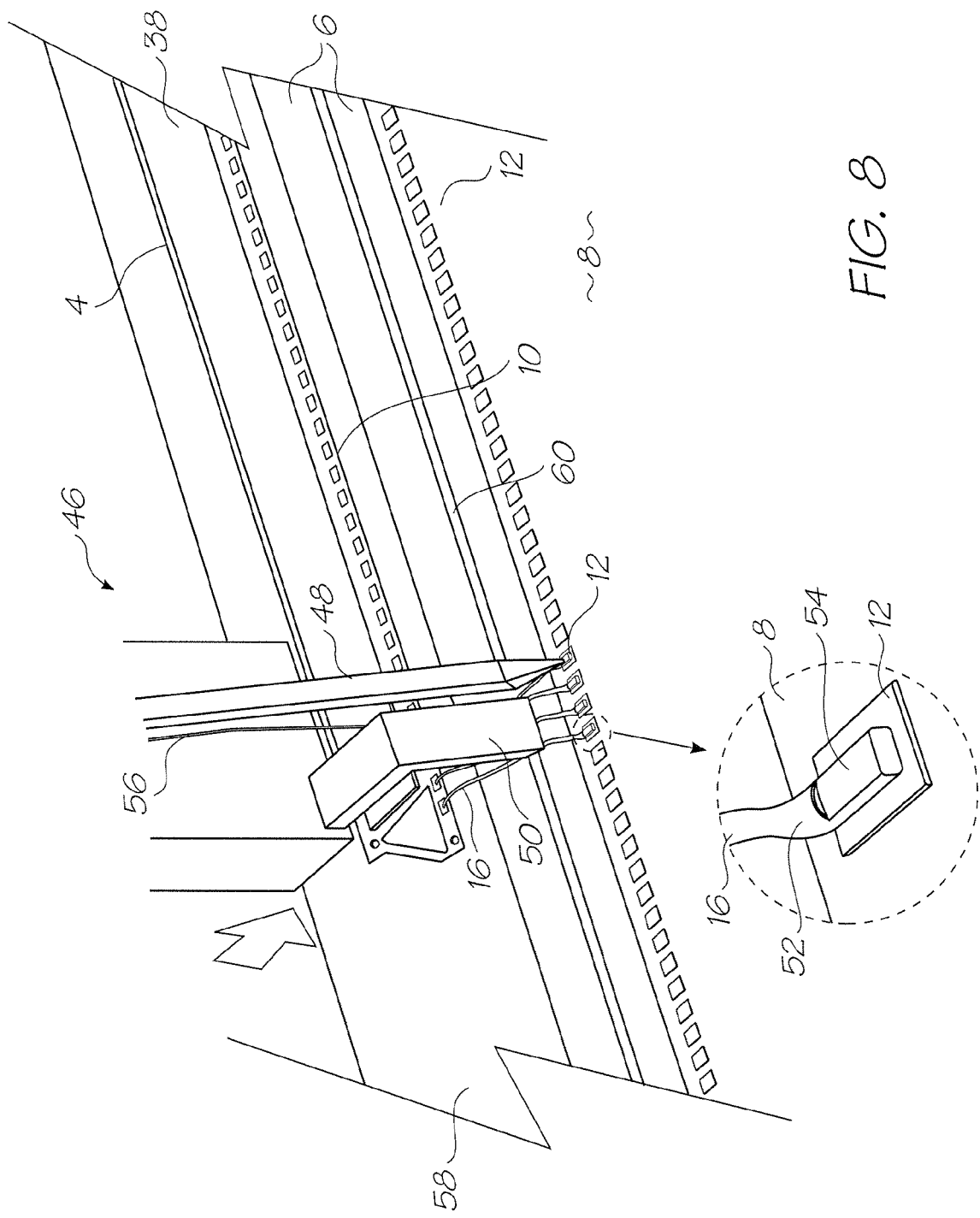
FIG. 8 shows the wire pusher mounted to the wirebonder.
Figure 9:
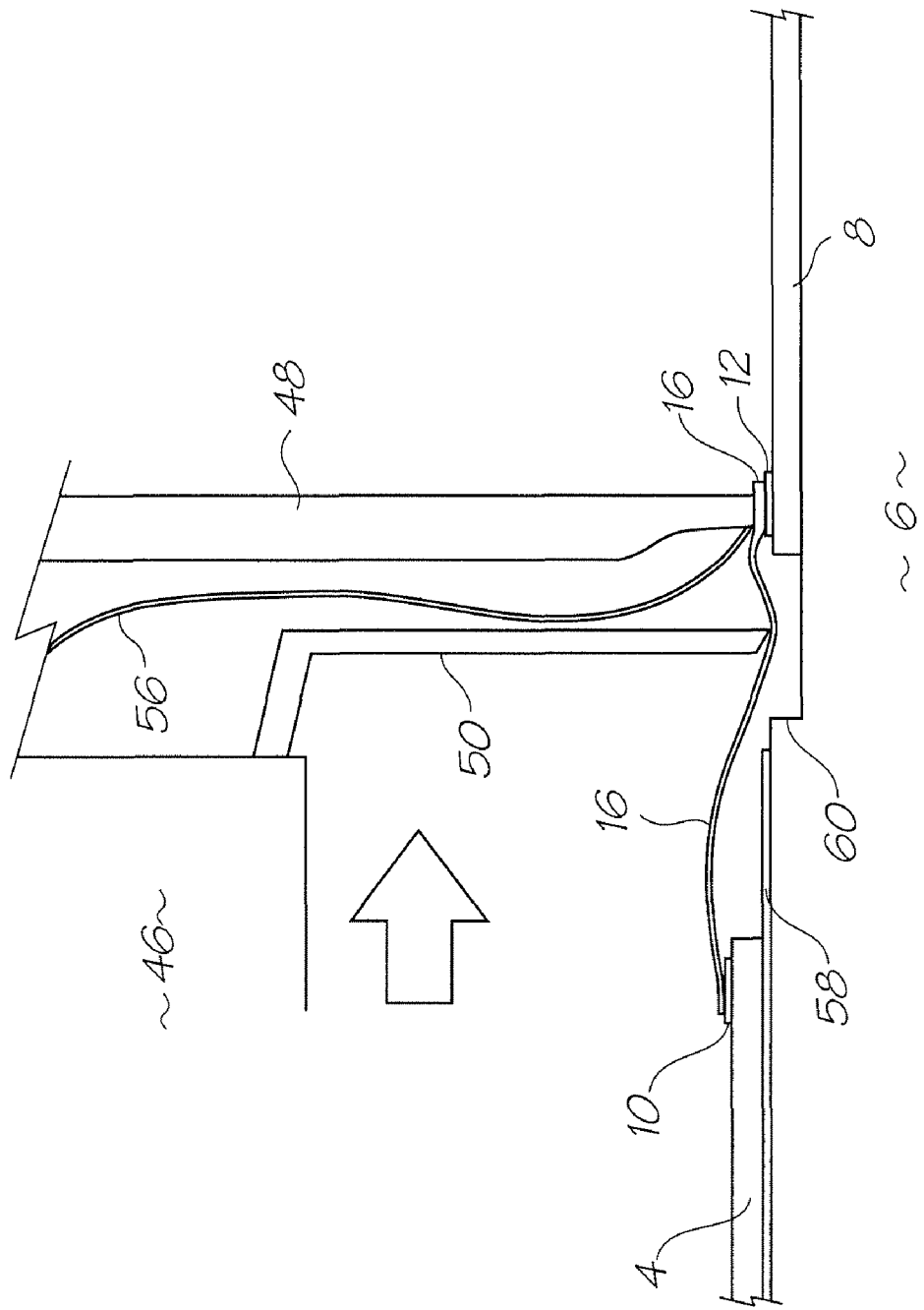
FIG. 9 shows the wire pusher and the wire bonder in profile.

FIGS. 8 and 9 show a technique for individually deforming each of the wire bond arcs using the wirebonder. This has several advantages over the technique shown in FIGS. 4A to 4C described in the "PLASTIC DEFORMATION OF THE WIRE BOND ARCS" section above. Firstly, deforming the wire bonds as they are being attached by the wirebonder is more time efficient than pushing the line of wire bonds as a separate production step. Secondly, it has been found that individually engaging and deforming each wire in the line of wire bonds provides uniform results in terms of wire deformation and bond strength.

FIG. 8 is a schematic perspective of a wirebonder 46 forming the individual wire bonds 16 between the contact pads 10 and the conductors 12 on the flex PCB 8. The printhead IC 4 is shown adhered to one side of the die attach film 58. In turn, the die attach film 58 is attached to the LCP molding 6. Laser ablated holes through the die attach film 58 feed ink to the array of nozzles 38. The LCP molding six has a stepped surface 60 so that the printhead IC 4 is raised relative to the flex PCB eight. As discussed above this helps to reduce the height of the wire bonds 16.

The wire bonder 46 is commonly known in the industry as a "wedge type" wire bonder. The wedge 48 receives a stock of feed wire 56 at its tip. Using some combination of pressure, heat and ultrasonic energy, the end of the wire bond 16 is welded to one of the conductors 12 on the flex PCB 8, or one of the contact pads 10 on the printhead integrated circuit 4. FIG. 8 includes an enlarged inset showing the connection between the wire bond 16 and the conductor 12. The end of the wire has a flatten section 54 created by the tip of wedge 48. Adjacent to flatten section 54 is a neck portion 52 where the wire 16 transitions to its circular cross section. This neck section of the wire is work hardened and particularly prone to plastic deformation. In light of the greater propensity for plastic deformation at the neck portion 52, the wire bonder 46 is fitted with a wire engaging structure 50 pushes on the wire bond 16 in this region. However, the wire engaging structure 50 to not contact the wire bonds 16 too close to the neck portion 52 is this can break the wire. The skilled worker will appreciate the work hardening increases the brittleness of the metal. The applicant's testing has found that positioning the wire engaging structure 50 so that its tip is between 1.0 mm and 1.6 mm behind the tip of the wedge (with respect to its movement from the die to the flex) and 50 microns to 600 microns below the tip of the wedge produces suitable results. In particular, the best results were achieved with the tip of the wire engaging structure 50 positioned 1.2 mm to 1.5 mm behind the tip the wedge, and 100 microns to 300 microns below the tip of the wedge. This configuration gave wire bonds 16 less than 50 microns above the nozzle array 38, each with a bond strength between 3.5 g and 5 g.

The wire engaging structure 50 is formed from a material with the surface hardness less than that of the wire. This avoids surface indentations on the wire which may later become stress concentration sites.

Adhering the Wire Bond to Reduce Loop Heights

Figure 10:
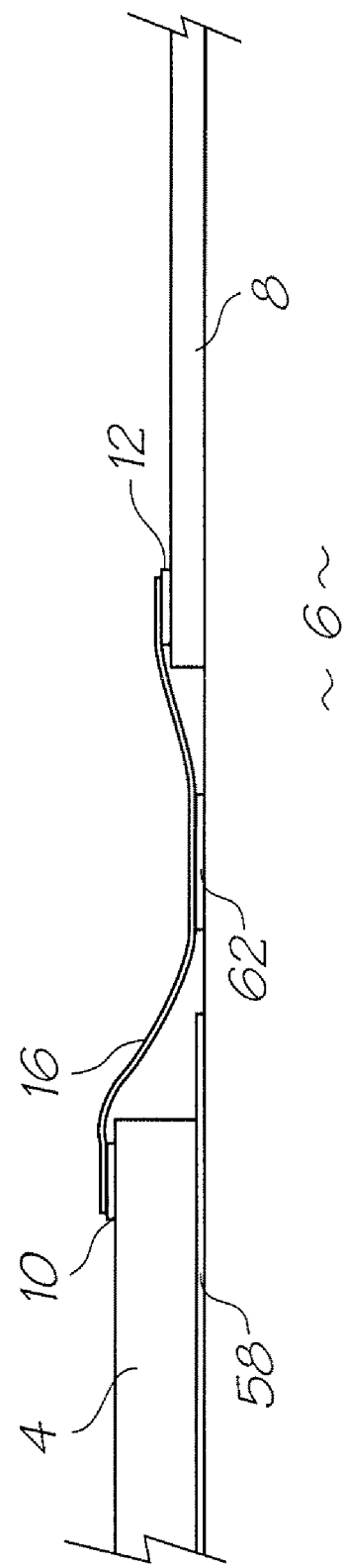
FIG. 10 shows the wire bonds adhered to the LCP molding between the die and the flex PCB.

FIG. 10 is a schematic section view of another technique used to reduce the height of the wire bond loops. An adhesive surface 62 is positioned on the LCP molding 6, between the contact pads 10 of the printhead IC 4 and the corresponding conductor 12 on the flex PCB 8. The Applicant has found that a wirebonder will usually allow the wire bond 16 to drape downwards and touch the surface between the die and PCB while the wire is bonded to the PCB conductor. Once the wire has been welded to the contact pad on the die, the bonding tool draws it towards the conductors on the printed circuit board. As it is drawn across the gap between the die and printed circuit board, the wire drapes downwardly and rests on the underlying surface. Once the bonding tool has welded the other end of the wire to the conductor, and the wire clamp immediately behind the bonding tool breaks off the feed wire by pulling until tensile failure, the residual tension in the loop cause it to bow upwards. By positioning adhesive 62 at the point of contact between the wire and the LCP 6, the wire bond 16 is unable to bow upwards to the same height.

The adhesive surface 62 may be double sided tape, an adhesive paste or resin jetted onto the LCP 6 when the die 4 and the flex 8 are fixed, or it could simply be an extension of the die attach film 58.

The invention has been described herein by way of example only. The ordinary will readily recognize many variations and modifications which do not depart from the spirit and scope of the broad inventive concept.

The invention claimed is:

1. An electronic device comprising:
   a supporting structure;
   an integrated circuit die with a plurality of contacts pads;
   a printed circuit board with a plurality of conductors corresponding to each of the contact pads respectively, the integrated circuit die and the PCB being mounted to the supporting structure by a die attach film such that they are adjacent and spaced from each other;
   wire bonds electrically connecting each of the contact pads to the corresponding conductors; and,
   an adhesive surface positioned between the contacts pads and the corresponding conductors; wherein,
   the wire bonds are secured to the adhesive surface and the adhesive surface is provided by a portion of the die attach film.

2. An electronic device according to claim 1 wherein the adhesive surface is one side of a double-sided adhesive tape.

3. An electronic device according to claim 1 wherein the PCB is a flexible PCB and the supporting structure is a liquid crystal polymer (LCP) molding.

4. An electronic device according to claim 1 wherein the wire bonds are formed from lengths of wire with a gauge between 15 microns and 75 microns.

5. An electronic device according to claim 4 wherein the gauge is about 25 microns.

6. An electronic device according to claim 4 wherein the wire bonds attach to respective contact pads on the IC die and the wire bonds do not extend more than 150 microns above the contact pads of the IC die.

7. An electronic device according to claim 6 wherein the line of wire bonds does not extend more than 50 microns above the contact pads of the IC die.

8. An electronic device according to claim 1 wherein the contact pads are spaced from the corresponding conductors on the PCB by more than 1 mm.

9. An electronic device according to claim 8 wherein the contact pads are between 2 mm and 3 mm from the corresponding conductors on the PCB.

10. An electronic device according to claim 1 wherein the PCB is a flexible PCB mounted to a support structure together with the die such that the conductors are adjacent the contact pads on the die.

11. An electronic device according to claim 10 wherein the support structure has a chip mounting area for supporting the die, the die having a back surface in contact with the chip mounting area and an active surface opposing the back surface, the active surface having the contact pads, and the chip mounting area being raised relative to the remainder of the support structure such that the contact pads are raised relative to the conductors.

12. An electronic device according to claim 4 wherein the wire bonds is formed using aluminium wire.

13. An electronic device according to claim 10 wherein the active surface has functional elements spaced less than 260 microns from the contacts pads of the die.

14. An electronic device according to claim 13 wherein the die is an inkjet printhead IC and the functional elements are nozzles through which ink is ejected.

15. An electronic device according to claim 14 wherein the printhead IC is configured to be mounted in a printer such that during use the nozzles are less than 100 microns from the paper path.

* * * * *